US009477796B2

United States Patent
Garcia-Ramirez et al.

(10) Patent No.: US 9,477,796 B2
(45) Date of Patent: Oct. 25, 2016

(54) METHODS FOR GENERAL STABILIZER-BASED QUANTUM COMPUTING SIMULATION

(71) Applicant: THE REGENTS OF THE UNIVERSITY OF MICHIGAN, Ann Arbor, MI (US)

(72) Inventors: Hector J. Garcia-Ramirez, Ypsilanti, MI (US); Igor L. Markov, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 14/719,884

(22) Filed: May 22, 2015

(65) Prior Publication Data

US 2015/0339417 A1      Nov. 26, 2015

Related U.S. Application Data

(60) Provisional application No. 62/002,338, filed on May 23, 2014.

(51) Int. Cl.
*G06F 17/50* (2006.01)
*G06F 17/10* (2006.01)
(Continued)

(52) U.S. Cl.
CPC ........... *G06F 17/5009* (2013.01); *G06F 17/16* (2013.01); *G06N 99/002* (2013.01); *B82Y 10/00* (2013.01)

(58) Field of Classification Search
CPC . G06F 17/16; G06F 17/5009; G06N 99/002; B82Y 10/00
See application file for complete search history.

(56) References Cited

U.S. PATENT DOCUMENTS 5,768,297 A * 6/1998 Shor ...................... B82Y 10/00
714/763
5,787,236 A * 7/1998 Tucci ...................... B82Y 10/00
706/52

(Continued)

FOREIGN PATENT DOCUMENTS

EP          1672569 A1     6/2006
WO    WO-2014-066054 A2   5/2014

OTHER PUBLICATIONS

Toward a software architecture for quantum computing design tools; K. Svore et al; Proc. QPL 2004, pp. 145-162.*
(Continued)

*Primary Examiner* — Akash Saxena
(74) *Attorney, Agent, or Firm* — Marshall, Gerstein & Borun LLP; Randall G. Rueth

(57) ABSTRACT

The disclosed method and computer-readable medium allow efficient simulation of both stabilizer and non-stabilizer states in general quantum circuits on a classical computer by maintaining global phases and orthogonalizing linear combinations of stabilizer states during simulation. This is accomplished by representing arbitrary quantum states as superpositions of stabilizer states, which may be implemented using one or more stabilizer frames. Each stabilizer frame includes a stabilizer matrix, one or more phase vectors corresponding to the stabilizer states, and an amplitude vector corresponding to the global phases of each stabilizer state. Orthogonality is maintained throughout the simulation for efficient computation and measurement. Some embodiments utilize a multiframe representation of the quantum state to reduce the number of stabilizer states required to represent the quantum state, which multiframe representation may also be used to implement parallel simulation.

10 Claims, 10 Drawing Sheets

(51) Int. Cl.
  *G06N 99/00* (2010.01)
  *B82Y 10/00* (2011.01)
  *G06F 17/16* (2006.01)

(56) References Cited

U.S. PATENT DOCUMENTS

| | | | | |
|---|---|---|---|---|
| 6,081,882 | A * | 6/2000 | Gossett | B82Y 10/00 712/1 |
| 6,128,764 | A * | 10/2000 | Gottesman | G06N 99/002 714/785 |
| 6,578,018 | B1 * | 6/2003 | Ulyanov | B82Y 10/00 706/14 |
| 7,184,555 | B2 | 2/2007 | Whaley et al. | |
| 7,451,292 | B2 | 11/2008 | Routt | |
| 8,972,237 | B2 * | 3/2015 | Wecker | G06N 99/002 703/13 |
| 9,269,052 | B2 * | 2/2016 | Svore | G06N 99/002 |
| 2003/0005010 | A1 * | 1/2003 | Cleve | G06N 99/002 708/403 |
| 2003/0093451 | A1 * | 5/2003 | Chuang | B82Y 10/00 708/520 |
| 2003/0169041 | A1 * | 9/2003 | Coury | G06N 99/002 324/307 |
| 2004/0238813 | A1 * | 12/2004 | Lidar | B82Y 10/00 257/31 |
| 2006/0224547 | A1 * | 10/2006 | Ulyanov | G06N 99/002 706/62 |
| 2012/0069414 | A1 * | 3/2012 | Nakamura | B82Y 10/00 359/107 |
| 2014/0118023 | A1 * | 5/2014 | Eastin | H03K 19/195 326/7 |
| 2014/0280404 | A1 * | 9/2014 | Svore | G06N 99/002 708/200 |
| 2014/0297708 | A1 * | 10/2014 | Svore | G06F 17/10 708/517 |
| 2014/0354326 | A1 * | 12/2014 | Bonderson | G06N 99/002 326/5 |
| 2014/0365843 | A1 * | 12/2014 | Ashikhmin | G06F 11/10 714/758 |
| 2015/0111754 | A1 * | 4/2015 | Harris | G06N 99/002 505/170 |
| 2015/0214984 | A1 * | 7/2015 | Ahn | G06N 99/002 714/755 |

OTHER PUBLICATIONS

Improved simulation of stabilizer circuits Scott Aaronson et al; Physical Review A 70, 052328 (2004); pp. 1-14.*
Rao, "The Next Generation Computing Brainwave—Quantum Computing", *International Journal of Hybrid Information Technology*, 19-30 (2010).
International Search Report and Written Opinion, corresponding International Application No. PCT/US2015/032159, mailing date Oct. 6, 2015.
Aronson et al., Improved simulation of stabilizer circuits, Phys. Rev. A, 70:052328 (2004).
Garcia et al., Efficient inner-product algorithm for stabilizer states, arXiv preprint arXiv:1210.6646 (2012).
Garcia et al., On the geometry of stabilizer states, Quantum Information and Computation, 14(7&8):683-720 (2014).
Garcia et al., Quipu: High-performance simulation of quantum circuits using stabilizer frames, Computer Design (ICCD), 2013 IEEE 31st International Conference, pp. 404-410 (2013).
Garcia et al., Simulation of quantum circuits via stabilizer frames, IEEE Transactions on Computers (2013).
Gottesman, Stabilizer codes and quantum error correction, Caltech Ph.D. Thesis, 114 pages, arXiv:quant-ph/9705052 (1997).

* cited by examiner $$\begin{matrix} \pm \\ \pm \\ \vdots \\ \pm \end{matrix} \begin{bmatrix} Z_1 & I & \cdots & I \\ I & Z_2 & I & \vdots \\ \vdots & I & \ddots & I \\ I & \cdots & I & Z_n \end{bmatrix}$$

FIG. 2

$$|\psi\rangle = a_1(|00\rangle + |01\rangle) + a_2(|10\rangle + |11\rangle)$$

$$a = (a_1, a_2)$$

$$\mathcal{M} = \begin{bmatrix} Z & I \\ I & X \end{bmatrix}$$

Phase vectors $\sigma_1: (+, +)$
$\sigma_2: (-, +)$ $\mathcal{F}$ $\mathcal{M}^{\sigma_1} = \begin{bmatrix} +Z & I \\ +I & X \end{bmatrix} \equiv |00\rangle + |01\rangle$ $\mathcal{M}^{\sigma_2} = \begin{bmatrix} -Z & I \\ +I & X \end{bmatrix} \equiv |10\rangle + |11\rangle$

*FIG. 3*

$|\psi\rangle = \begin{bmatrix} + & X & / & / \\ + & / & X & / \\ + & / & / & Z \end{bmatrix} \xrightarrow{CoF_{1,2}}$ $|\psi\rangle = |000\rangle + |010\rangle + |100\rangle + |110\rangle$ $|\psi;c_1c_2=00\rangle \equiv |000\rangle \quad |\psi;c_1c_2=10\rangle \equiv |100\rangle$ $\begin{bmatrix} + & Z & / & / \\ + & / & Z & / \\ + & / & / & Z \end{bmatrix} \quad \begin{bmatrix} - & Z & / & / \\ + & / & Z & / \\ + & / & / & Z \end{bmatrix}$ $|\psi;c_1c_2=01\rangle \equiv |010\rangle \quad |\psi;c_1c_2=11\rangle \equiv |110\rangle \xrightarrow{X_3} |\psi;c_1c_2=11\rangle \equiv |111\rangle$ $\begin{bmatrix} + & Z & / & / \\ - & / & Z & / \\ + & / & / & Z \end{bmatrix} \quad \begin{bmatrix} - & Z & / & / \\ - & / & Z & / \\ + & / & / & Z \end{bmatrix} \quad \begin{bmatrix} - & Z & / & / \\ - & / & Z & / \\ - & / & / & Z \end{bmatrix}$

*FIG. 4*

METHODS FOR GENERAL STABILIZER-BASED QUANTUM COMPUTING SIMULATION

CROSS-REFERENCE TO RELATED APPLICATIONS

This application claims the benefit of U.S. Provisional Application No. 62/002,338, entitled "Methods For General Stabilizer-Based Quantum Computing Simulation," which was filed on May 23, 2014, the entirety of which is incorporated by reference herein.

GOVERNMENT RIGHTS

This invention was made with government support under Grant No. FA8750-11-2-0043 from the United States Air Force Office of Scientific Research. The government has certain rights in the invention.

TECHNICAL FIELD

The invention relates generally to methods for simulating quantum computing operations on classical computers and, more particularly, to methods for efficiently simulating general quantum states by superposition of stabilizer states.

BACKGROUND

Quantum information processing manipulates quantum states rather than conventional 0-1 bits. It has been demonstrated with a variety of physical technologies (NMR, ion traps, Josephson junctions in superconductors, optics, etc.) and used in recently developed commercial products. Algorithms such as Shor's factoring algorithm and Grover's search algorithm apply the principles of quantum information to carry out certain computations asymptotically more efficiently than classical computers. Quantum computers hold great potential for complex computations in computational chemistry, biology, medicine, physics, and other fields. These developments have fueled research efforts to design, build and program scalable quantum computers. Due to the high volatility of quantum information, quantum error-correcting codes and effective fault-tolerant architectures are necessary to build reliable quantum computers. Most quantum algorithms are described in terms of quantum circuits and, similar to conventional digital circuits, require functional simulation to determine the best fault-tolerant design choices given limited resources. In particular, high-performance simulation is a key component in quantum design that facilitates analysis of trade-offs between performance and accuracy.

Simulating quantum circuits on a classical computer is a difficult problem. The matrices representing quantum gates, and the vectors that model quantum states grow exponentially with an increase in the number of qubits the quantum analogue of the classical computing bit. Several software packages have been developed for quantum circuit simulation including Oemer's Quantum Computation Language (QCL) and Viamontes' Quantum Information Decision Diagrams (QuIDD) implemented in the QuIDDPro package. While QCL simulates circuits directly using state vectors, QuIDDPro uses a variant of binary decision diagrams to store state vectors more compactly in some cases. Since the state-vector representation requires excessive computational resources in general, simulation-based reliability studies (e.g. fault injection analysis) of quantum fault-tolerant architectures using general-purpose simulators has been limited to small quantum circuits. Although certain stabilizer circuits have been identified and can be efficiently simulated on classical computers, the stabilizer circuits are of limited use. Stabilizer circuits must contain only stabilizer gates, which do not form a universal set for quantum computation. Therefore, stabilizer circuits alone do not permit efficient simulation of general quantum circuits.

SUMMARY

Disclosed herein are a method and computer-readable medium for the efficient simulation of quantum circuits using classical computers. One embodiment includes a method for maintaining global phases during simulation of at least one quantum gate of a quantum computer using a classical computer. The method includes the following: receiving a quantum state that is a superposition of a plurality of stabilizer states (wherein the quantum state is represented by a stabilizer matrix associated with the plurality of stabilizer states, a plurality of phase vectors representing each of the stabilizer states, and an amplitude vector with each entry in the amplitude vector representing a global phase associated with one of the plurality of phase vectors); receiving a matrix representation of the at least one quantum gate; and determining the effect of the at least one quantum gate on the quantum state in a plurality of iterations, each of which includes: applying one of the plurality of phase vectors to the stabilizer matrix, determining an input basis state associated with the one phase vector applied to the stabilizer matrix, determining an input non-zero amplitude associated with the input basis state, determining a first output non-zero amplitude associated with an output basis state by applying the matrix representation of the at least one quantum gate to the input non-zero amplitude and the input basis state, determining a second output non-zero amplitude of the output basis state using the stabilizer matrix and the matrix representation of the at least one quantum gate, and adjusting the entry in the amplitude vector associated with the one phase vector applied to the stabilizer matrix, wherein the entry is adjusted proportionally to the first output non-zero amplitude and the second output non-zero amplitude. Another embodiment includes a tangible, non-transitory computer-readable medium storing instructions for maintaining global phases during simulation of at least one quantum gate of a quantum computer using a classical computer that, when executed by one or more processors of the classical computer, cause the classical computer to perform corresponding operations.

In some embodiments of the method and computer-readable medium, at least one quantum gate of the quantum computer is not a stabilizer gate (i.e., the quantum gate is not a Hadamard, phase, or CNOT gate). In additional embodiments, the a set of the quantum gates may form a universal set for quantum computation (e.g., a set including a Hadamard gate and a Toffoli gate). In still further embodiments, the stabilizer matrix may be in canonical form, which greatly simplifies operations such as implementation of gates and measurement. Also to improve efficiency of the simulation, further embodiments may include compressing the received quantum state into a stabilizer frame (containing the stabilizer matrix, the plurality of phase vectors, and the amplitude vector), and then determining the effect of a plurality of the quantum gates on the quantum state using the stabilizer frame without uncompressing the stabilizer frame for measurement until the plurality of quantum gates have been applied to the quantum state. Thus, a general quantum circuit containing a plurality of (stabilizer or non-stabilizer) quantum gates may be simulated efficiently while the quantum state remains compressed (i.e., represented by a stabilizer frame). In additional embodiments, a linear combination of a plurality of mutually orthogonal stabilizer frames (i.e., a muliframe representation) may be used.

Another embodiment includes a method for orthogonalization of a linear combination of stabilizer states during simulation of a quantum circuit using a classical computer. The method includes the following: receiving a linear combination of stabilizer states (wherein the linear combination includes a plurality of stabilizer states represented by canonical stabilizer matrices and a plurality of coefficients associated with the plurality of stabilizer states); and orthogonalizing the linear combination of stabilizer states in each of one or more iterations, each of which includes: identifying a column in which at least two of the canonical stabilizer matrices contain different types of Pauli literals, decomposing each of the stabilizer matrices that contain an X or Y Pauli literal in the identified column into a first matrix and a second matrix (wherein the first matrix and the second matrix represent stabilizer states that are nearest neighbors of the stabilizer state associated with the decomposed stabilizer matrix), determining a first global phase factor of the first matrix and a second global phase factor of the second matrix associated with each of the decomposed stabilizer matrices, and replacing each of the decomposed stabilizer matrices and their associated coefficients with (i) the first matrix and a first coefficient proportionate to the first global phase factor associated with the decomposed stabilizer matrix and (ii) the second matrix and a second coefficient proportionate to the second global phase factor associated with the decomposed stabilizer matrix. Another embodiment includes a tangible, non-transitory computer-readable medium storing instructions for orthogonalization of a linear combination of stabilizer states during simulation of a quantum circuit using a classical computer that, when executed by one or more processors of the classical computer, cause the classical computer to perform corresponding operations.

In some embodiments, decomposing each of the stabilizer matrices may further include (i) identifying a row in the stabilizer matrix that contains an X or Y Pauli literal in the identified column, (ii) causing every other row in the stabilizer matrix that commutes with the identified row to anticommute with the identified row, (iii) creating the first matrix from the revised stabilizer matrix by replacing the row with a first new row containing a positive Z Pauli literal in the identified column, and (iv) creating the second matrix from the revised stabilizer matrix by replacing the row with a second new row containing a negative Z Pauli literal in the identified column. This will preserve the form of the stabilizer matrix and remove redundant literals.

In further embodiments, the linear combination of stabilizer states may comprise a linear combination of stabilizer frames representing a quantum state, and the method or computer readable medium may further determine the effect of at least one quantum gate on the linear combination of stabilizer states by applying a matrix representation of the quantum gate to each of the stabilizer frames. The one or more quantum gates may include at least one measurement gate, and determining the effect of the measurement gate may include determining an outcome probability of a state using normalized outcome probabilities of the state in each of the frames. In some embodiments, at least one of the quantum gates is not a stabilizer gate (i.e., the quantum gate is not a Hadamard, phase, or CNOT gate). In still further embodiments, the operations of the other embodiments may be implemented in parallel on at least two groups, with each of the groups containing at least one of the stabilizer frames.

BRIEF DESCRIPTION OF THE DRAWINGS

The figures described below depict various aspects of the applications, methods, and systems disclosed herein. It should be understood that each figure depicts an embodiment of a particular aspect of the disclosed applications, systems and methods, and that each of the figures is intended to accord with a possible embodiment thereof. Furthermore, wherever possible, the following description refers to the reference numerals included in the following figures, in which features depicted in multiple figures are designated with consistent reference numerals.

FIG. 2 illustrates an exemplary form of a stabilizer matrix in basis form.

FIG. 3 illustrates an exemplary stabilizer frame representing a quantum state as a superposition of stabilizer states.

FIG. 4 illustrates an exemplary simulation of the effect of a Toffoli gate on a quantum state using a stabilizer frame.

DETAILED DESCRIPTION

Figure 1:
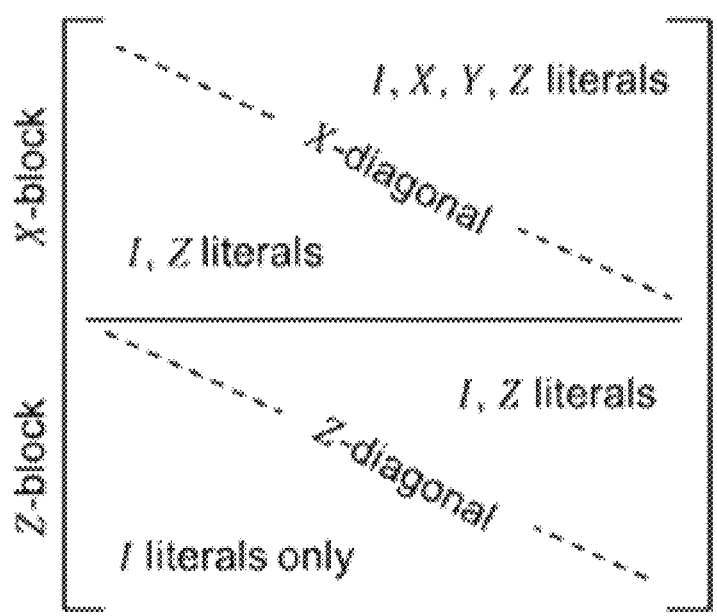
FIG. 1 illustrates an exemplary form of a stabilizer matrix in canonical form.

Although the following text sets forth a detailed description of numerous different embodiments, it should be understood that the legal scope of the invention is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning (as would be understood by a person having ordinary skill in the art), and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112(f).

As discussed above, the invention as described herein relates to the simulation of quantum computing circuits using a classical computer. As used herein, the term "classical computer" means any general use or specialized computer based on classical physics that processes data using one or more processors by implementing executable instructions stored in a computer-readable medium. This may include one or more personal computers, laptops, servers, or special-purpose computing devices. The term "classical computer" is used in contrast to quantum computers, which are based on quantum physics. Throughout this specification, actions not otherwise attributed to a device should be understood to be performed using a classical computer. In some embodiments, this may include implementation by a software program or module executed by the one or more processors of the one or more classical computers. Simulation of quantum circuits using classical computers is advantageous in the development and testing of quantum computers and related quantum computing devices. Additionally, or alternatively, the methods described herein may be useful in adapting algorithms developed for quantum computers for implementation on classical computers.

Stabilizer Circuits and States

Stabilizer circuits form an important subclass of quantum circuits that can be simulated efficiently on classical computers. Stabilizer circuits are exclusively composed of stabilizer gates—Hadamard (H), Phase (R), and controlled-NOT (CNOT) gates followed by one-qubit measurements in the computational basis. Such circuits may be applied to a computational basis state (e.g., $|00\ldots0\rangle$) to produce output states known as stabilizer states. Stabilizer states have extensive applications in quantum error-correcting codes and effective fault-tolerant architectures. Stabilizer circuits can be efficiently simulated in polynomial-time by keeping track of the Pauli operators that stabilize the quantum state. Such stabilizer operators are maintained during simulation and uniquely represent stabilizer states up to an unobservable global phase, significantly reducing the computational resources needed to simulate stabilizer circuits using vector-based representations. This represents an exponential improvement over vector-based quantum circuit simulations. Although the stabilizer operators obtain this increase in speed, the global phases of the computational states are not maintained numerically in such simulations. As described below, we develop a method of efficiently maintaining the global phase and expand the scope of circuits that can be simulated using stabilizer states.

We describe herein a generalization of the stabilizer formalism to admit simulation of non-stabilizer gates, such as Toffoli gates, possibly in addition to stabilizer gates. Unlike previous attempts to maintain quantum states as sums of density-matrix terms, we store quantum states as superpositions of pure stabilizer states, thus improving both memory usage and processing efficiency of the classical computer. Reducing memory requirements is important to quantum computing simulations because of the exponential growth of memory requirements in relation to the number of qubits in other simulation methods. Moreover, our approach results in improved efficiency of processing capacity of the classical computer, as described below with respect to improvements in processing runtime order of magnitude, as discussed below. Our approach allows more compact storage without the need to handle mixed stabilizer states. In order to simulate quantum states as superpositions of stabilizer states, however, it is necessary to maintain the global phases because the phases of the states become relative in our approach.

Quantum information processes, including quantum algorithms, are often modeled using quantum circuits and represented by diagrams. Quantum circuits are sequences of gate operations that act on some register of qubits—the basic unit of information in a quantum system. A single qubit is described by a quantum state $|\psi\rangle$, which is a two-dimensional complex-valued vector. In contrast to classical bits, qubits can be in a superposition of the 0 and 1 states. Formally, $|\psi\rangle = \alpha_0|0\rangle + \alpha_1|1\rangle$, where $|0\rangle = (1,0)^T$ and $|1\rangle = (0,1)^T$ are the two-dimensional computational basis states and $\alpha_i$ are probability amplitudes that satisfy $|\alpha_0|^2 + |\alpha_1|^2 = 1$. An n-qubit register is the tensor product of n single qubits and thus is modeled by a complex vector $|\psi\rangle = |\psi_1\rangle \otimes \ldots \otimes |\psi_n\rangle = \Sigma_{i=0}^{2^n-1} \alpha_i |b_i\rangle$, where each $b_i$ is a binary string representing the value i of each basis state. Furthermore, $\psi^n$ satisfies $\Sigma_{i=0}^{2^n-1} |\alpha_i|^2 = 1$. Each gate operation or quantum gate is a unitary matrix that operates on a small subset of the qubits in $$X = \begin{pmatrix} 0 & 1 \\ 1 & 0 \end{pmatrix}.$$

a register. For example, the quantum analogue of a NOT gate is the linear operator $$\alpha_0|00\rangle + \alpha_1|10\rangle \xmapsto{X \otimes I} \alpha_0|10\rangle + \alpha_1|00\rangle$$

Similarly, the two-qubit CNOT operator flips the second qubit (target) if and only if the first qubit (control) is set to 1, e.g., $$\alpha_0|00\rangle + \alpha_1|10\rangle \xmapsto{CNOT} \alpha_0|00\rangle + \alpha_1|11\rangle$$

Another operator of particular importance is the Hadamard gate (H), which is frequently used to put a qubit in a superposition of computational-basis states, e.g., $$\alpha_0|00\rangle + \alpha_1|10\rangle \xmapsto{I \otimes H} \frac{\alpha_0(|00\rangle + |01\rangle) + \alpha_1(|10\rangle + |11\rangle)}{\sqrt{2}}$$

It is important to note that the H gate generates unbiased superpositions in the sense that the squares of the absolute value of the amplitudes are equal. The final stabilizer gate is the phase gate (R), which applies a phase-shift factor of $e^i$ if the qubit is in the $|1\rangle$ state. These three stabilizer gates may be represented in matrix form as follows:

$$H = \frac{1}{\sqrt{2}} \begin{pmatrix} 1 & 1 \\ 1 & -1 \end{pmatrix}$$

$$R = \begin{pmatrix} 1 & 0 \\ 0 & i \end{pmatrix}$$

-continued $$CNOT = \begin{pmatrix} 1 & 0 & 0 & 0 \\ 0 & 1 & 0 & 0 \\ 0 & 0 & 0 & 1 \\ 0 & 0 & 1 & 0 \end{pmatrix}$$

The dynamics involved in observing a quantum state are described by non-unitary measurement operators. There are different types of quantum measurements, including projective measurements in the computational basis (i.e., measurements with respect to the basis states, viz. the distances of the measured states from the $|0\rangle$ or $|1\rangle$ states). The corresponding measurement operators are $$P_0 = \begin{pmatrix} 1 & 0 \\ 0 & 0 \end{pmatrix}$$

and $$P_1 = \begin{pmatrix} 0 & 0 \\ 0 & 1 \end{pmatrix},$$

respectively. The probability p(x) of obtaining outcome $x \in \{0,1\}$ on the $j^{th}$ qubit of state $|\psi\rangle$ is given by the inner product $\langle \psi | P_x^j | \psi \rangle$, where $\langle \psi |$ is the conjugate transpose of $|\psi\rangle$. For example, the probability of obtaining $|1\rangle$ upon measuring $|0\rangle = \alpha_0 |0\rangle + \alpha_1 |1\rangle$ is $$p(1) = (\alpha^*_0, \alpha^*_1) P_1 (\alpha_0, \alpha_1)^T = (0, \alpha^*_1)(\alpha_0, \alpha_1)^T = |\alpha_1|^2$$

The output states obtained after performing computational-basis measurements are called "cofactors," and are states of the form $|0\rangle |\psi_0\rangle$ and $|1\rangle |\psi_1\rangle$. It is important to note that these states are orthogonal to each other and add up to the original state. We will use this property of cofactors extensively to represent states as superpositions of orthogonal stabilizer states. The norms of cofactors and the original state are subject to the Pythagorean theorem. We denote the $|0\rangle$- and $|1\rangle$-cofactors by $|\psi^{c=0}\rangle$ and $|\psi^{c=1}\rangle$, respectively, where c is the index of the measured qubit. One can also consider iterated cofactors, such as double cofactors $|\psi^{qr=00}\rangle$, $|\psi^{qr=01}\rangle$, $|\psi^{qr=10}\rangle$, and $|\psi^{qr=11}\rangle$. Cofactoring with respect to all qubits produces amplitudes of individual basis vectors.

To simulate a quantum circuit C, we first initialize the quantum system to some desired state $|\psi\rangle$ (usually a basis state). $|\psi\rangle$ can be represented using a fixed-size data structure (e.g., an array of $2^n$ complex numbers) or a variable-size data structure (e.g., algebraic decision diagram). We then track the evolution of $|\psi\rangle$ via its internal representation as the gates in C are applied one at a time, eventually producing the output state $C|\psi\rangle$. Most quantum-circuit simulators support some form of the linear-algebraic operations on matrix representations of quantum states. The drawback of such simulators is that their runtime and memory requirements grow exponentially with the number of qubits. This holds true not only in the worst case, but also in practical applications involving quantum arithmetic and quantum fault-tolerant circuits. Our approach improves the memory and runtime efficiency of such simulations using superposition of stabilizer states.

The stabilizer formalism presents a method of representing quantum states by keeping track of their symmetries, rather than their complex-valued vectors and amplitudes. The symmetries are linear operators for which the states are 1-eigenvectors. Algebraically, symmetries form group structures, which can be specified compactly by group generators. According to the stabilizer formalism, a unitary operator U stabilizes a state $|\psi\rangle$ if and only if $|\psi\rangle$ is a 1-eigenvector of the unitary operator U (i.e., $U|\psi\rangle = |\psi\rangle$). Several such stabilizer operators U can be derived from the Pauli matrices:

$$X = \begin{pmatrix} 0 & 1 \\ 1 & 0 \end{pmatrix}, Y = \begin{pmatrix} 0 & -i \\ i & 0 \end{pmatrix},$$

and $$Z = \begin{pmatrix} 1 & 0 \\ 0 & -1 \end{pmatrix}.$$

The one-qubit states stabilized by the Pauli matrices are:
X: $(|0\rangle + |1\rangle)/\sqrt{2}$  -X: $(|0\rangle - |1\rangle)/\sqrt{2}$
Y: $(|0\rangle + i|1\rangle)/\sqrt{2}$  -Y: $(|0\rangle - i|1\rangle)/\sqrt{2}$
Z: $|0\rangle$  -Z: $|1\rangle$
The identity matrix $$I = \begin{pmatrix} 1 & 0 \\ 0 & 1 \end{pmatrix}$$

is also a stabilizer matrix for all states, but $-I$ does not stabilize any state. As an example of the application of the stabilizer operators, the entangled state $$\frac{|00\rangle + |11\rangle}{\sqrt{2}}$$

is stabilized by the Pauli operators and the identity matrix: $X \otimes X$, $Y \otimes Y$, $Z \otimes Z$, and $I \otimes I$.

Table I is a multiplication table of the Pauli operators X, Y, and Z and the identity matrix I. It should be noted that the Pauli matrices X, Y, and Z and the identity matrix I form a closed group under matrix multiplication with the multiplicative factors $\pm 1$ and $\pm i$. Formally, the Pauli group $g_n$ on n qubits consists of the n-fold tensor product of Pauli matrices, $P = i^k P_i \otimes \ldots \otimes P_n$ such that $P_j \in \{I,X,Y,Z\}$ and $k \in \{0,1,2,3\}$. The tensor-product symbol may be omitted for brevity, so P is denoted by a string of I, X, Y, or Z characters and a separate integer value k for the phase $i^k$. As used herein, the term "Pauli literal" refers to any of the characters X, Y, or Z and the term "literal" refers to any of the characters I, X, Y, or Z. The string-integer pair representation allows us to compute the product of Pauli operators using the Pauli literals, without explicitly computing the tensor products because $(A \otimes B)(C \otimes D) = (AC \otimes BD)$ for matrices A, B, C, and D in the general case. For example, the product of four-qubit Pauli groups $(-IIXI)(iIYII) = -iIYXI$. Since $|g_n| = 4^{n+1}$, $g_n$ can have at most $\log_2 |g_n| = \log_2 4^{n+1} = 2(n+1)$ irredundant generators. The stabilizer formalism is of particular importance because it allows simulations of quantum computers to represent an n-qubit quantum state $|\psi\rangle$ by its stabilizer group $S(|\psi\rangle)$, which is the subgroup of $g_n$ that stabilizes $|\psi\rangle$. If $|S(|\psi\rangle)| = 2^n|$, then $S(|\psi\rangle)$ can have at most $\log_2 |S(|\psi\rangle)| = \log_2 2^n = n$ irredundant generators, so the group $S(|\psi\rangle)$ uniquely specifies $|\psi\rangle$. Therefore, an arbitrary n-qubit stabilizer state can be represented by a stabilizer matrix $\mathcal{M}$ whose rows represent a set of generators $Q_1, \ldots, Q_n$ for $S(|\psi\rangle)$. As used herein, a "stabilizer matrix" $\mathcal{M}$ is a matrix whose rows represent a set of generators $Q_1, \ldots, Q_n$ for the stabilizer group $S(|\psi\rangle)$ for a state $|\mathcal{M}\rangle$. Although we refer to stabilizer matrices and use matrix notation throughout, it should be understood that other equivalent representations may instead be used (e.g., graphs). Since each $Q_i \in S(|\psi\rangle)$ is a string of n Pauli literals, the size of the stabilizer matrix $\mathcal{M}$ is n×n. Therefore, the storage cost of the stabilizer matrix $\mathcal{M}$ is $O(n^2)$ in the worst case, which is an exponential improvement over the up to $O(2^n)$ storage cost of vector-based simulations. Furthermore, $Q_i \in S(|\psi\rangle)$ implies that the leading phase of $Q_i$ can only be ±1 and not ±i because $Q_i^2$ cannot be −I, which does not stabilize any state. The phases of all of the generator vectors $Q_i$ can thus be stored in a phase vector σ of n entries, with each entry representing either a + or a − phase.

TABLE I

Multiplication table for Pauli matrices.

|   | I | X | Y | Z |
|---|---|---|---|---|
| I | I | X | Y | Z |
| X | X | I | iZ | -iY |
| Y | Y | -iZ | I | iX |
| Z | Z | iY | -iX | I |

Shaded cells indicate anticommuting products.

Although stabilizer states are uniquely determined by their stabilizer groups $\mathcal{G}_n$, the sets of generators $Q_i$ in the stabilizer matrices $\mathcal{M}$ may be selected in different ways. For example, the state $$|\psi\rangle = \frac{|00\rangle + |11\rangle}{\sqrt{2}}$$

is uniquely specified by any of the following stabilizer matrices:

$$\mathcal{M}_1 = \begin{matrix} + \\ + \end{matrix} \begin{bmatrix} X & X \\ Z & Z \end{bmatrix}, \mathcal{M}_2 = \begin{matrix} + \\ - \end{matrix} \begin{bmatrix} X & X \\ Y & Y \end{bmatrix},$$

and $$\mathcal{M}_1 = \begin{matrix} - \\ + \end{matrix} \begin{bmatrix} Y & Y \\ Z & Z \end{bmatrix}.$$

$\mathcal{M}_2$ may be obtained from $\mathcal{M}_1$ by row multiplication, and $\mathcal{M}_3$ may be similarly obtained from $\mathcal{M}_1$ or $\mathcal{M}_2$. Multiplying any row by itself in these stabilizer matrices results in II, which stabilizes the state $|\psi\rangle$. A row made up of only identity matrices I cannot be used as a generator $Q_i$, however, because it is redundant and carries no information about the structure of $|\psi\rangle$. Any stabilizer matrix $\mathcal{M}$ can be rearranged by elementary row operations to obtain a particular matrix structure, including reduced row echelon form (canonical form), without modifying the stabilizer state. Such elementary row operations include transposition (swapping the order of rows) and multiplication (left-multiplying a row by another row). Using Gaussian elimination, a stabilizer matrix $\mathcal{M}$ can be reduced to canonical form as illustrated in FIG. 1. The canonical form of a stabilizer matrix $\mathcal{M}$ contains an X-block and a Z-block, such that the X-block contains a minimal set of rows with X or Y Pauli literals. The Z-block contains rows that only include Z Pauli literals and I literals, and the Z-block likewise contains a minimal set of rows with Z Pauli literals. Additionally, the number of Pauli literals in each of the X-block and the Z-block is minimal. The X-block and the Z-block, respectively, contain an X-diagonal and a Z-diagonal. All Pauli X and Y literals are found on or above the X-diagonal within the X-block. Similarly, all Pauli Z literals are found on or above the Z-diagonal in the Z-block or in the X-block. Only I literals are found below the Z-diagonal within the Z-block.

In some embodiments, the Gaussian elimination procedure may implement the following Algorithm 1 in Table II to obtain the canonical form of the stabilizer matrix $\mathcal{M}$. Algorithm 1 starts with the stabilizer matrix $\mathcal{M}$ and iteratively determines which row operations to apply based on the Pauli literals contained in the first row and column of an increasingly smaller submatrix A of the full stabilizer matrix $\mathcal{M}$. After the appropriate row operations are applied to the submatrix A, the dimensions of the submatrix A are reduced for the next iteration. Algorithm 1 performs the process in two parts. First, the algorithm positions the X and Y Pauli literals at the top of the stabilizer matrix $\mathcal{M}$. Second, the algorithm positions the Z Pauli literals at the bottom of the stabilizer matrix $\mathcal{M}$. Specifically, take an n×n stabilizer matrix $\mathcal{M}$, with rows indexed by $i \in \{1, \ldots, n\}$ and columns indexed by $j \in \{1, \ldots, n\}$, where i and j are the indices associated with the first row and column, respectively, of the submatrix A. In each iteration of the first part of Algorithm 1, the following steps are iteratively performed. First, identify a row $R_k$ with index $k \in \{1, \ldots, n\}$ in the submatix A whose $j^{th}$ literal is X or Y, and swap row $R_k$ with row $R_i$. Second, find any additional rows $R_m$ with index $m \in \{1, \ldots, n\}$ such that m≠i that has an X or Y Pauli literal in the $j^{th}$ column, and left-multiply the row $R_m$ by row $R_i$ to set the $j^{th}$ literal of row $R_m$ to Z or I. Third, reduce the height of the submatrix A by one (i.e., set i=i+1), and reduce the width of the submatrix A by one (i.e., set j=j+1). Once the first part of Algorithm 1 is finished, the second part is iteratively performed to reduce the set of Z Pauli literals in the Z-block to the minimal set. Without resetting the row index i, the second part begins by resetting the column index j=1. The second part of the algorithm then iterates over j by implementing the following steps. First, identify a row $R_k$ with index $k \in \{1, \ldots, n\}$ in the submatix A whose $j^{th}$ literal is Z, and swap row $R_k$ with row $R_i$. Second, find any additional rows $R_m$ with index $m \in \{1, \ldots, n\}$ such that m≠i that has an Z or Y Pauli literal in the $j^{th}$ column, and left-multiply the row $R_m$ by row $R_i$ to ensure the columns of the canonical stabilizer matrix $\mathcal{M}$ have at most two distinct types of Pauli literals. Third, reduce the height of the submatrix A by one (i.e., set i=i+1), and reduce the width of the submatrix A by one (i.e., set j=j+1).

TABLE II

```
Input: Stabilizer matrix M for S(|ψ⟩) with rows R_1,...,R_n
Output: M is reduced to row-echelon form
⇒ ROWSWAP(M,i,j) swaps rows R_i and R_j of M
⇒ ROWMULT(M,i,j) left-multiplies rows R_i and R_j, returns updated R_j
 1:  i ← 1
 2:  for j ∈ {1,...,n} do                                           ▷ Setup X block
 3:      k ← index of row R_{k∈{i,...,n}} with j^th literal set to X(Y)
 4:      if k exists then
 5:          ROWSWAP(M,i,k)
 6:          for m ∈ {0,...,n} do
 7:              if j^th literal of R_m is X or Y and m ≠ i then
 8:                  R_m = ROWMULT(M, R_i, R_m)                     ▷ Gauss-Jordan elimination step
 9:              end if
10:          end for
11:          i ← i + 1
12:      end if
13:  end for
14:  for j ∈ {1,...,n} do                                           ▷ Setup Z block
15:      k ← index of row R_{k∈{i,...,n}} with j^th literal set to Z
16:      if k exists then
17:          ROWSWAP(M,i,k)
18:          for m ∈ {0,...,n} do
19:              if j^th literal of R_m is Z or Y and m ≠ i then
20:                  R_m = ROWMULT(M, R_i, R_m)                     ▷ Gauss-Jordan elimination step
21:              end if
22:          end for
23:          i ← i + 1
24:      end if
25:  end for
```

Using the canonical form of a stabilizer matrix $\mathcal{M}$ allows us to simulate quantum circuits efficiently (as described below) by maintaining the structure of the stabilizer matrix. For deterministic computational basis states (e.g., $|00\ldots0\rangle$), the canonical stabilizer matrix will contain only Z and I literals because each qubit is either $|0\rangle$ or $|1\rangle$, but not a superposition. Therefore, a stabilizer matrix is in basis form if it has Z Pauli literals along its diagonal and I literals everywhere off its diagonal, combined with a phase vector $\sigma$. FIG. 2 illustrates the form of a stabilizer matrix in basis form. Because the basis state is deterministic, the basis form stabilizer matrix has only Z Pauli literals along its diagonal, and only I literals in every other position. The leading ± signs indicate the entries in the associated phase vector $\sigma$ may be either + or − for each row. In this basis form, the ± sign of each row j and its corresponding $Z_j$ literal designates whether the state of the $j^{th}$ qubit in the basis state $|\psi\rangle$ associated with the stabilizer matrix $\mathcal{M}$ is $|0\rangle$ (+) or $|1\rangle$ (−).

To simulate a quantum circuit C containing a sequence of quantum gates $U \in C$, the basis stabilizer matrix $\mathcal{M}$ corresponding to the basis state $|\psi\rangle$ is used. To simulate the action of each gate U, we conjugate each row $Q_i$ of $\mathcal{M}$ by U. Since $Q_i|\psi\rangle = |\psi\rangle$, the resulting state $U|\psi\rangle$ is stabilized by $UQ_iU\dagger$ because $(UQ_i U\dagger)U|\psi\rangle = UQ_i|\psi\rangle = U|\psi\rangle$. In order to ensure that resulting output matrix M' is a well-formed stabilizer matrix, it is necessary that $UQ_iU\dagger$ maps to another string of X, Y, Z, and 1-literals. The Hadamard (H), Phase (R), and controlled-NOT (CNOT) gates have such mappings. Table III lists the Pauli literal mappings for each of these gates. As an example of simulation using the stabilizer representation described above, the operation of a CNOT gate on a basis state of $$|\psi\rangle = \frac{|00\rangle + |11\rangle}{\sqrt{2}}$$

can be represented as follows:

$$\mathcal{M}_\psi = \begin{matrix}+\\+\end{matrix}\begin{bmatrix} X & X \\ Z & Z \end{bmatrix} \xrightarrow{CNOT} \mathcal{M}'_\psi = \begin{matrix}+\\+\end{matrix}\begin{bmatrix} X & I \\ I & Z \end{bmatrix}$$

It should be noted that the rows of the output matrix $\mathcal{M}'_\psi$ stabilizes $$|\psi\rangle \xrightarrow{CNOT} \frac{|00\rangle + |10\rangle}{\sqrt{2}}.$$

TABLE III

Conjugation of Pauli-group elements by stabilizer gates [18]. For the CNOT case, subscript 1 indicates the control and 2 the target.

| GATE | INPUT | OUTPUT | GATE | INPUT | OUTPUT |
|------|-------|--------|------|-------|--------|
| H    | X     | Z      | CNOT | $I_1 X_2$ | $I_1 X_2$ |
|      | Y     | −Y     |      | $X_1 I_2$ | $X_1 X_2$ |
|      | Z     | X      |      | $I_1 Y_2$ | $Z_1 Y_2$ |
| P    | X     | Y      |      | $Y_1 I_2$ | $Y_1 X_2$ |
|      | Y     | −X     |      | $I_1 Z_2$ | $Z_1 Z_2$ |
|      | Z     | Z      |      | $Z_1 I_2$ | $Z_1 I_2$ |

Since the H, R, and CNOT gates can be simulated directly using stabilizers, these gates are commonly called "stabilizer gates," and circuits including only stabilizer gates are referred to as unitary "stabilizer circuits." To simulate a stabilizer gate using a stabilizer matrix $\mathcal{M}$, Table III of conjugations of Pauli-group elements by stabilizer gates indicates that at most two columns of the stabilizer matrix $\mathcal{M}$ must be updated. Thus, stabilizer gates are simulated in $\Theta(n)$ time. Furthermore, for any pair of Pauli operators A and B, $ABA\dagger = (-1)^c B\dagger$, where $c=0$ if A and B commute and $c=1$ otherwise. Thus, Pauli gates can also be simulated in linear time as they only permute the phase vector of the stabilizer matrix.

The stabilizer formalism also admits measurements in the computational basis and conveniently avoids direct computation of projection operators and inner products. Note that any qubit j in a stabilizer state is either in a state of $|0\rangle$ or $|1\rangle$ (a deterministic outcome) or in an unbiased superposition of both $|0\rangle$ and $|1\rangle$ (a random outcome). Deterministic and random outcomes may be differentiated in $\Theta(n)$ time by searching for X or Y Pauli literals in the $j^{th}$ column of $\mathcal{M}$. Where such X or Y literals are found, the $j^{th}$ qubit must be in superposition, and the outcome is random with equal probability (e.g., $(p(|0\rangle)=p(|1\rangle))=0.5)$. Where such X or Y literals are not found, the $j^{th}$ qubit is deterministic (e.g., $p(|0\rangle)=1$ or $p(|1\rangle)=1$).

To measure the random outcome case, the $j^{th}$ qubit may be updated using any known means of obtaining a random binary measurement (e.g., equivalent to the flip of an unbiased coin) may be used to obtain a deterministic outcome for the $j^{th}$ qubit. For example, a random number generator may be used to determine whether the $j^{th}$ qubit should be updated to $|0\rangle$ or $|1\rangle$. In the stabilizer matrix $\mathcal{M}$, this corresponds to replacing the row $R_j$ with an X or Y literal in its $j^{th}$ column with a row $Z_j$ with a Z literal in its $j^{th}$ column and I literals elsewhere. The phase of row $Z_j$ is set in the phase vector $\sigma$ of $\mathcal{M}$ to match the deterministic state of qubit j (e.g., $|0\rangle$ or $|1\rangle$). Since rows $R_j$ and $Z_j$ anticommute, the stabilizer matrix $\mathcal{M}$ may then be examined for rows that anticommute with row $Z_j$ and updated by multiplying such anticommuting rows by $R_j$ to make them commute with row $Z_j$. Alternatively, the rows of $\mathcal{M}$ that anticommute with $Z_j$ may be updated prior to replacing row $R_j$ with row $Z_j$.

To measure the deterministic outcome case, the sign of the Z literal that stabilizes the qubit must be determined. In some embodiments, Gaussian elimination may be applied to reduce the stabilizer matrix $\mathcal{M}$ to row-echelon form. This removes redundant literals from the stabilizer matrix $\mathcal{M}$, allowing identification of row $Z_j$ with a Z literal in its $j^{th}$ column and I literals elsewhere. Alternatively, if $\mathcal{M}$ is maintained in reduced row-echelon form, the row $Z_j$ is simply identified. Once row $Z_j$ is identified, the phase of the Z literal associated with the $j^{th}$ qubit is determined from the corresponding entry in the phase vector $\sigma$.

In quantum mechanics, the states $e^{i\theta}|\psi\rangle$ and $|0\rangle$ are considered phase-equivalent because $e^{i\theta}$ does not affect the statistics of measurement. Since the stabilizer formalism simulates stabilizer gates using their action by conjugation, such global phases are not maintained. For example, a basis state of $|1\rangle$ is stabilized by the literal $-Z$. Conjugation by the phase gate R yields $R(-Z)R^\dagger$, but the phase-vector representation $$|1\rangle \xrightarrow{R} i|1\rangle$$

indicates that the phase gate R applied to basis state $|1\rangle$ should yield $i|1\rangle$. In this example, the global phase i is not maintained by the stabilizer formalism. Since global phases are unobservable, they do not need to be maintained when simulating a single stabilizer state. When dealing with superpositions of stabilizer states, however, the global phases must be maintained because the global phases become relative.

Stabilizer Frames

The stabilizer gates discussed above do not by themselves form a universal set for quantum computation. In some embodiments, therefore, simulation of a quantum computer may include at least one quantum gate of the quantum computer that is not a stabilizer gate. The Hadamard (H) and Toffoli (TOF) gates, for example, do form a universal set. The TOF gate is a 3-qubit gate that maps $(c_1, c_2, t)$ to $(c_1, c_2, t\oplus(c_1c_2))$, having the effect of a controlled-CNOT gate. The H gate is a stabilizer gate, but the TOF gate is not. To simulate TOF and other non-stabilizer gates, we extend the stabilizer formalism to include the representation of arbitrary quantum states as the superpositions of stabilizer states. Since computational basis states are stabilizer states, any one-qubit state $|\psi\rangle = \alpha_1|0\rangle + \alpha_2|1\rangle$ is a superposition of the two stabilizer states $|0\rangle$ and $|1\rangle$. In general, any state decomposition in a computational basis state is a stabilizer decomposition. Note that if $|\psi\rangle$ is an unbiased superposition such that $|\alpha_1|^2=|\alpha_2|^2$, then $|\psi\rangle$ can be represented using a single stabilizer state, up to a global phase. This underlies our method of identifying and compressing large unbiased superpositions on the fly during simulation to reduce resource requirements. To do this, we develop a simulation technique based on stabilizer frames of orthogonal stabilizer states.

As used herein, an n-qubit "stabilizer frame" $\mathcal{F}$ is a set of $k \leq 2^n$ stabilizer states $\{|\psi_j\rangle\}_{j=1}^n$ that forms an orthogonal subspace in the Hilbert space. The stabilizer frame $\mathcal{F}$ may be represented by a pair consisting of (i) the stabilizer matrix $\mathcal{F}$ and (ii) a set of distinct phase vectors $\{\sigma_j\}_{j=1}^k$. $\sigma_{j=1}^k$, where $\sigma_j \in \{\pm 1\}^n$. We denote the ordered assignment of the elements in phase vector $\sigma_j$, as the $(\pm 1)$-phases of the rows of $\mathcal{M}$ by matrix $\mathcal{M}^{\sigma_j}$. The size of the frame $|\mathcal{F}|$ is equal to k. To represent an arbitrary state $|\Psi\rangle$ using the frame $\mathcal{F}$, we maintain an additional amplitude vector $\alpha=(\alpha_1, \ldots, \alpha_k)$ of complex amplitudes corresponding to the decomposition of $|\Psi\rangle$ in the basis $\{|\psi_j\rangle\}_{j=1}^k$ defined by the frame $\mathcal{F}$, i.e., $|\Psi\rangle = \sum_{j=1}^k \alpha_j |\psi_j\rangle$ and $\sum_{j=1}^k |\alpha_j|^2 = 1$. Note that each amplitude $\alpha_j$ forms a pair with the corresponding phase vector $\sigma_1$ since $|\psi_j\rangle \equiv \mathcal{M}^{\sigma_j}$.

Simulation using the stabilizer frames represents any state $|\Psi\rangle$ as a superposition of stabilizer states. For example, FIG. 3 represents a state $|\Psi\rangle = \alpha_1(|00\rangle+|01\rangle)+\alpha_2(|10\rangle+|11\rangle)$ as a stabilizer frame $\mathcal{F}$ with stabilizer matrix $$\mathcal{M} = \begin{bmatrix} Z & I \\ I & X \end{bmatrix},$$

phase vectors $\sigma_1=(+,+)$ and $\sigma_2=(-,+)$, and amplitude vector $\alpha=(\alpha_1, \alpha_2)$. As noted above, the stabilizer matrix $\mathcal{M}$ can be combined with the set of phase vectors $\sigma$ to obtain $$\mathcal{M}^{\sigma_1} = \begin{matrix} + \\ + \end{matrix} \begin{bmatrix} Z & I \\ I & X \end{bmatrix}$$

and $$\mathcal{M}^{\sigma_2} = \begin{matrix} - \\ + \end{matrix} \begin{bmatrix} Z & I \\ I & X \end{bmatrix}.$$

Note that, although the state $|\Psi\rangle$ has four computational basis amplitudes, the frame only has two phase vectors $\sigma_1$ and $\sigma_2$. Where $|\alpha_1|^2=|\alpha_2|^2$, the frame $\mathcal{F}$ can be manipulated to reduce its size $|\mathcal{F}|$, as discussed below.

As another example, the action of the TOF gate on an n-qubit state $|\Psi\rangle$ with control qubits $c_1$ and $c_2$ and target qubit t can be simulated using the frame $\mathcal{F}$ illustrated in FIG. 4. First, we decompose $|\Psi\rangle$ into all four of its double cofactors over the control qubits to obtain the following unbiased superposition of orthogonal states:

$$|\psi\rangle = \frac{|\Psi^{c_1c_2=00}\rangle + |\Psi^{c_1c_2=01}\rangle + |\Psi^{c_1c_2=10}\rangle|\Psi^{c_1c_2=11}\rangle}{2}$$

Then, the action of the TOF gate may be computed as follows:

$$TOF_{c_1c_2t}|\psi\rangle = (|\psi^{c_1c_2=00}\rangle + |\psi^{c_1c_2=01}\rangle + |\psi^{c_1c_2=10}\rangle + X_t|\psi^{c_1c_2=11}\rangle)/2$$

where $X_t$ is the Pauli X gate (corresponding to a NOT gate) acting on the target qubit t. As in the example above, each double cofactor $|\psi_{c_1c_2}\rangle$ is represented by the same stabilizer matrix $$\mathcal{M} = \begin{bmatrix} Z & I & I \\ I & Z & I \\ I & I & Z \end{bmatrix},$$

but each double cofactor $|\psi_{c_1c_2}\rangle$ has a distinct phase vector: $\sigma_{c_1c_2=00}=(+, +, +)$, $\sigma_{c_1c_2=10}=(-, +, +)$, $\sigma_{c_1c_2=01}=(+, -, +)$, and $\sigma_{c_1c_2=11}=(-, -, +)$. The four phase vector-stabilizer matrix combinations $$\mathcal{M}^{\sigma_{c_1c_2=00}}, \mathcal{M}^{\sigma_{c_1c_2=10}}, \mathcal{M}^{\sigma_{c_1c_2=01}}, \mathcal{M}^{\sigma_{c_1c_2=11}}$$

are also represented in FIG. 4. Note that the phase vector $\sigma_{c_1c_2=11}$ and the phase vector-stabilizer matrix combination $$\mathcal{M}^{\sigma_{c_1c_2=11}}$$

may be updated to simulate the action of the $X_t$ gate. Thus, $\sigma_{c_1c_2=11}=(-, -, -)$, and $$\mathcal{M}^{\sigma_{c_1c_2=11}} = \begin{bmatrix} -Z & I & I \\ -I & Z & I \\ -I & I & Z \end{bmatrix}.$$

An amplitude vector $\alpha=(\alpha_{c_1c_2=00}, \alpha_{c_1c_2=10}, \alpha_{c_1c_2=01}, \alpha_{c_1c_2=11})$ is likewise maintained. Enabling simulation of the TOF gate is particularly important because the TOF gate and the H gate form a universal set for quantum computation, and the H gate is a stabilizer gate.

Like the TOF gate, the controlled-phase gate $R(\alpha)_{ct}$ can also be simulated using stabilizer frames. The controlled-phase gate $R(\alpha)_{ct}$ applies a phase-shift factor of $e^{i\alpha}$ to a target qubit t if both the target qubit t and a control qubit c are set (i.e., c=1 and t=1). It is used with the H gate to implement the quantum Fourier transform circuit, which plays a key role in Shor's factoring algorithm. With cofactoring, the action of the $R(\alpha)_{ct}$ gate on a state $|\Psi\rangle$ may be computed as follows:

$$R(\alpha)_{ct}|\psi\rangle = (|\psi^{ct=00}\rangle + |\psi^{ct=01}\rangle + |\psi^{ct=10}\rangle + e^{i\alpha}|\psi^{ct=11}\otimes\rangle)/2$$

This can be simulated on a classical computer by cofactoring $|\Psi\rangle$ over the c and t qubits, determining the phase vectors $\sigma_j \in \{1, \ldots, |\mathcal{F}|\}$, and setting the amplitude vector $\alpha \in \{\alpha_1, \ldots, \alpha_i \mathcal{F}_i\}$. Then, for every phase vector $\sigma_j$ corresponding to the $|\Psi^{ct=11}\rangle$ cofactor, shift the phase of the $j^{th}$ qubit by setting $\alpha_j=\alpha_j e^{i\alpha}$. Note that this may result in a biased superposition.

Since the states in a stabilizer frame $\mathcal{F}$ are orthogonal, the outcome probability when measuring the output of a circuit simulated using the stabilizer frame $\mathcal{F}$ is equal to the sum of the outcome probabilities of each state $|\psi_i\rangle$, normalized with respect to the entries in the amplitude vector $\alpha$. Thus, for a superposition of states $|\Psi\rangle = \Sigma_i \alpha_i |\psi_i\rangle$ represented by $\mathcal{F}$, the probability of observing an outcome $x \in \{0,1\}$ upon measuring qubit m is $$p(x)\varphi = \sum_{i=1}^{k} |\alpha_i|^2 \langle\psi_i|P_x^m|\psi_i\rangle = \sum_{i=1}^{k} |\alpha_i|^2 p(x)\varphi_i$$

where $P_x^m$ denotes the measurement operators $P_0$ and $P_1$ discussed above. As discussed above, the probability $p(x)_\psi$ can then be used to determine an outcome state $|0\rangle$ or $|1\rangle$ using a random number generator or other means of obtaining a binary outcome from a known probability. The frame $\mathcal{M}$ may then be cofactored such that only the states consistent with the measurement remain in the frame $\mathcal{M}$.

Efficient Computation of Global Phases

As noted above, simulation of superpositions of stabilizer states using stabilizer frames requires tracking the relative global states of the stabilizer states. In quantum mechanics, the states $e^{i\theta}|\psi\rangle$ and $|\psi\rangle$ are considered phase-equivalent because $e^{i\theta}$ does not affect the statistics of measurement. During stabilizer-based simulation, such global phases are not maintained. Since these phases are unobservable, this is not a problem when simulating a single stabilizer state. We manipulate superpositions of states, however, so the global phases become relative and must be maintained. As discussed above, we maintain the global phases of n-qubit states in stabilizer frames $\mathcal{F}$ using amplitude vectors $\alpha$, such that each entry $\alpha_j \in \{1, \ldots, k\}$ is a global phase corresponding to phase vector $\sigma_j$ and stabilizer matrix $\mathcal{M}^{\sigma_j}$. To maintain the global phase when simulating quantum gate U, each global phase $\alpha_j$ is updated using a global phase maintenance method in accordance with the description herein.

Figure 5:
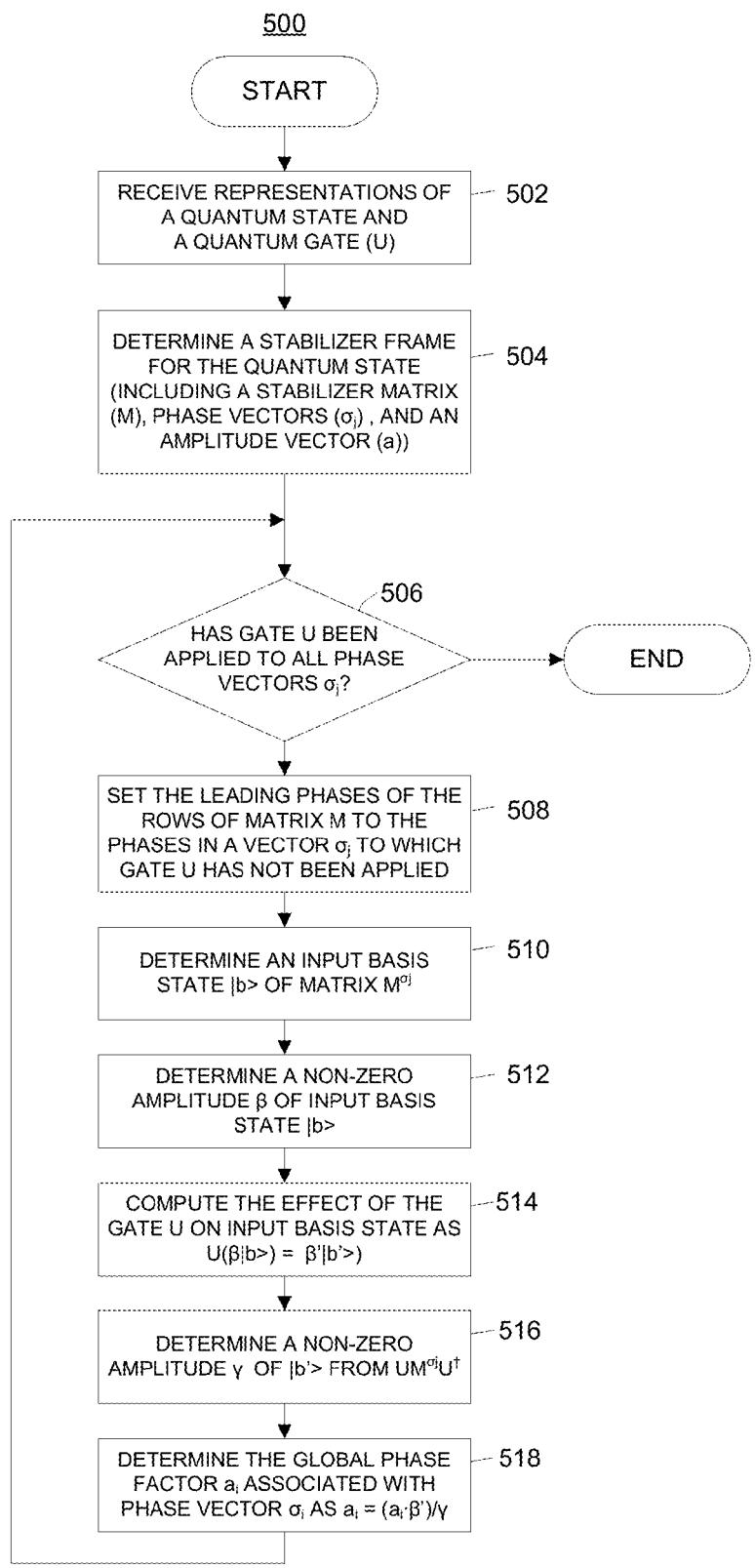
FIG. 5 illustrates a flow diagram of an exemplary global phase maintenance method.

FIG. 5 illustrates a flow diagram of an exemplary global phase maintenance method 500. The method 500 begins at block 502, when a representation of a quantum state $|\psi\rangle$ and a quantum gate U are received by a processor of a classical computer simulating a quantum circuit. The quantum state $|\psi\rangle$ and a quantum gate U may be stabilizer or non-stabilizer states or gates. The classical computer may then determine a stabilizer frame $\mathcal{F}$ representing the quantum state $|\psi\rangle$ as a superposition of stabilizer states at block 504. The stabilizer frame $\mathcal{F}$ includes one or more stabilizer matrices $\mathcal{M}$, a plurality of phase vectors $\sigma_j$ corresponding to the k stabilizer states in $\mathcal{F}$, and an amplitude vector a corresponding to the phase vectors $\sigma_j$. In some embodiments the quantum state $|\psi\rangle$ may be received as a stabilizer frame $\mathcal{F}$, in which case block 504 may be removed. The classical computer then iterates through the stabilizer states in $\mathcal{F}$ for all j∈{1, . . . , k}. At block 506, the classical computer determines whether the quantum gate U has been applied to each pair of phase vectors $\sigma_j$∈{1, . . . , k} and amplitudes $\alpha_j$∈{1, . . . , k}. This may be accomplished by means of a for loop (e.g., with counter i=1, . . . , k) or by other known means. When the quantum gate U has been applied to all phase vectors $\sigma_j$ (i.e., after k iterations), the implementation of the method 500 is complete. Prior to completion, blocks 508-518 are applied for each j∈{1, . . . , k}.

At block 508, the classical computer sets the leading phases of stabilizer matrix $\mathcal{M}$ to the values in phase vector $\sigma_j$ to produce stabilizer matrix $\mathcal{M}^{\sigma j}$ for some j∈{1, . . . , k} that has yet to be updated by application of the quantum gate U. Next, the classical computer determines an input basis state |b⟩ of the matrix $\mathcal{M}^{\sigma j}$ prior to application of the quantum gate U at block 510. Similarly, the non-zero amplitude of the basis state |b⟩ is determined at block 512. At block 514, the classical computer computes the action of the quantum gate U on the basis state as U(β|b⟩)=β'|b'⟩ via matrix-vector multiplication using the matrix representation of U and the vector representation of β|b⟩. The first output non-zero amplitude β' is obtained from the output basis state |b'⟩ and stored. At block 516, the classical computer determines a second non-zero amplitude γ of basis state |b'⟩ from U$\mathcal{M}$U†. Finally, the global phase $\alpha_j$ in the amplitude vector α is updated at block 518 as $$a_j = \frac{a_j \beta'}{\gamma}.$$

Where the quantum gate U is a Hadamard gate, the non-zero amplitude may be determined as the sum of a real and a complex non-zero amplitude in block 512. For example, where |ψ⟩=(|00⟩+|01⟩−i|10⟩−i|11⟩) (with the normalization factor omitted for simplicity), the generator set for $\mathcal{M}$ is {−YI,IX}. The orthonormal basis states |00⟩ and i|10⟩ are obtained from $\mathcal{M}$, and the non-zero amplitude β=1 (the amplitude of |00⟩$\mathcal{M}$). The action of the H gate at block 514 is computed as $$H_1(|00\rangle + i|10\rangle) = \frac{(1-i)}{\sqrt{2}}|00\rangle + \frac{(1+i)}{\sqrt{2}}|10\rangle,$$

so $$\beta' = \frac{(1-i)}{\sqrt{2}}.$$

Then, at block 516, the amplitude of |00⟩ is obtained from $H_1 \mathcal{M} H_1$†={YI,IX}, which yields γ=1. The global phase may then be adjusted by the global phase factor $$\frac{\beta'}{\gamma} = \frac{(1-i)}{\sqrt{2}}.$$

In some embodiments, Gaussian elimination may be used to determine the non-zero amplitudes β, β', and γ. In other embodiments, the non-zero amplitudes β, β', and γ may be sampled from the leading phases $\sigma_j$ and the literals of $\mathcal{M}$ where the stabilizer matrix $\mathcal{M}$ is in row-echelon form. Performing Gaussian elimination on all stabilizer matrices $\mathcal{M}$ in $\mathcal{F}$ requires $O(n^3|\mathcal{F}|)$ time (in the worst case). Since stabilizer gates affect at most two columns of $\mathcal{M}$, the stabilizer matrix $\mathcal{M}$ may be maintained in row-echelon form in the worst case in $O(n^2)$ time using row multiplication. Therefore, for the n-qubit stabilizer frame $\mathcal{F}$, the overall runtime for simulating a single stabilizer gate is up to $O(n^2+n|\mathcal{F}|)$, since the updates to $\mathcal{M}$ required to compute each $\alpha_j$ can be memorized using known techniques to avoid redundant computation. For this reason, it is advantageous to maintain the stabilizer matrix $\mathcal{M}$ in row-echelon form throughout the simulation.

Orthogonalization of Linearly Dependent
Combinations of Stabilizer States

As discussed above, measurement of frames and other combinations of quantum states is simplified where the states are mutually orthogonal. To simulate measurements of an arbitrary state |Ψ⟩, therefore, it is helpful to transform the set of stabilizer states that represent |Ψ⟩ into an orthogonal set. For any linear combination of stabilizer states |Ψ⟩=$\sum_{j=1}^{n} c_j|\psi_j\rangle$ where each stabilizer state |$\psi_j$⟩ is represented by its own stabilizer matrix, we can transform the stabilizer states |ψ⟩ into an orthogonal basis by decomposition.

Since a linear combination of stabilizer states is not generally a stabilizer state, Gram-Schmidt orthogonalization cannot be use directly. Therefore, we develop an orthogonalization procedure that exploits the nearest-neighbor structure of stabilizer states and their efficient manipulation via stabilizers. As used herein, a stabilizer state |φ⟩ is a "nearest-neighbor" of a stabilizer state |ψ⟩ with ‖|ψ⟩‖=1 if and only if $$|\langle \psi | \varphi \rangle| = \frac{1}{\sqrt{2}}.$$

Where two orthogonal stabilizer states |α⟩ and |β⟩ have an unbiased superposition |ψ⟩ that is also a stabilizer state, then $$|\langle \psi | \alpha \rangle| = |\langle \psi | \beta \rangle| = \frac{1}{\sqrt{2}},$$

so |α⟩ and |β⟩ are nearest neighbors of |ψ⟩. In general, any two stabilizer states have an equal number of nearest neighbor stabilizer states. Furthermore, any n-qubit stabilizer state |ψ⟩ has $4(2^n-1)$ nearest-neighbor stabilizer states of the form $$\frac{(|\psi\rangle + i^l|\varphi\rangle)}{\sqrt{2}},$$

where l∈{0,1,2,3} and where |ψ⟩ and |φ⟩ are orthogonal n-qubit stabilizer states. We can thus decompose |ψ⟩ into a superposition of nearest-neighbor stabilizer states $$\frac{(|\phi\rangle + i^l|\varphi\rangle)}{\sqrt{2}}$$

using Algorithm 2 in Table IV. Algorithm 2 takes as input a linear combination of n-qubit states represented by (i) a list of stabilizer matrices in canonical form M={$\mathcal{M}^1$, ..., $\mathcal{M}^N$} and (ii) a list of corresponding coefficients C={$c_1$, ..., $c_N$}. Algorithm 2 iterates over the columns j∈{1, ..., n} to select pivot columns where the column j differs between two matrices $\mathcal{M}^i$ ∈ M in lines 1-10. When two matrices in M are found to differ in their, $j^{th}$ columns, Algorithm 2 applies a decomposition procedure to all matrices $\mathcal{M}^i$∈M in lines 11-20, thereby making column j equivalent up to a phase-vector permutation in each of the matrices in M.

blocks 604-616 to identify dissimilarities and decompose the dissimilar matrices into similar matrices.

In block 606, the classical computer identifies a pivot column by determining a column containing different types of Pauli literals in at least two matrices in M. In some embodiments, the process may compare the literals of a test column in each matrix $\mathcal{M}^i$∈M only until a first pair of matrices in M with different types of Pauli literals is identified using known techniques. Additionally, or alternatively, the classical computer may compare one or more columns in each matrix $\mathcal{M}^i$∈M until a column is located where two or more matrices in M differ either in the types of Pauli literals

TABLE IV

Figure 6:
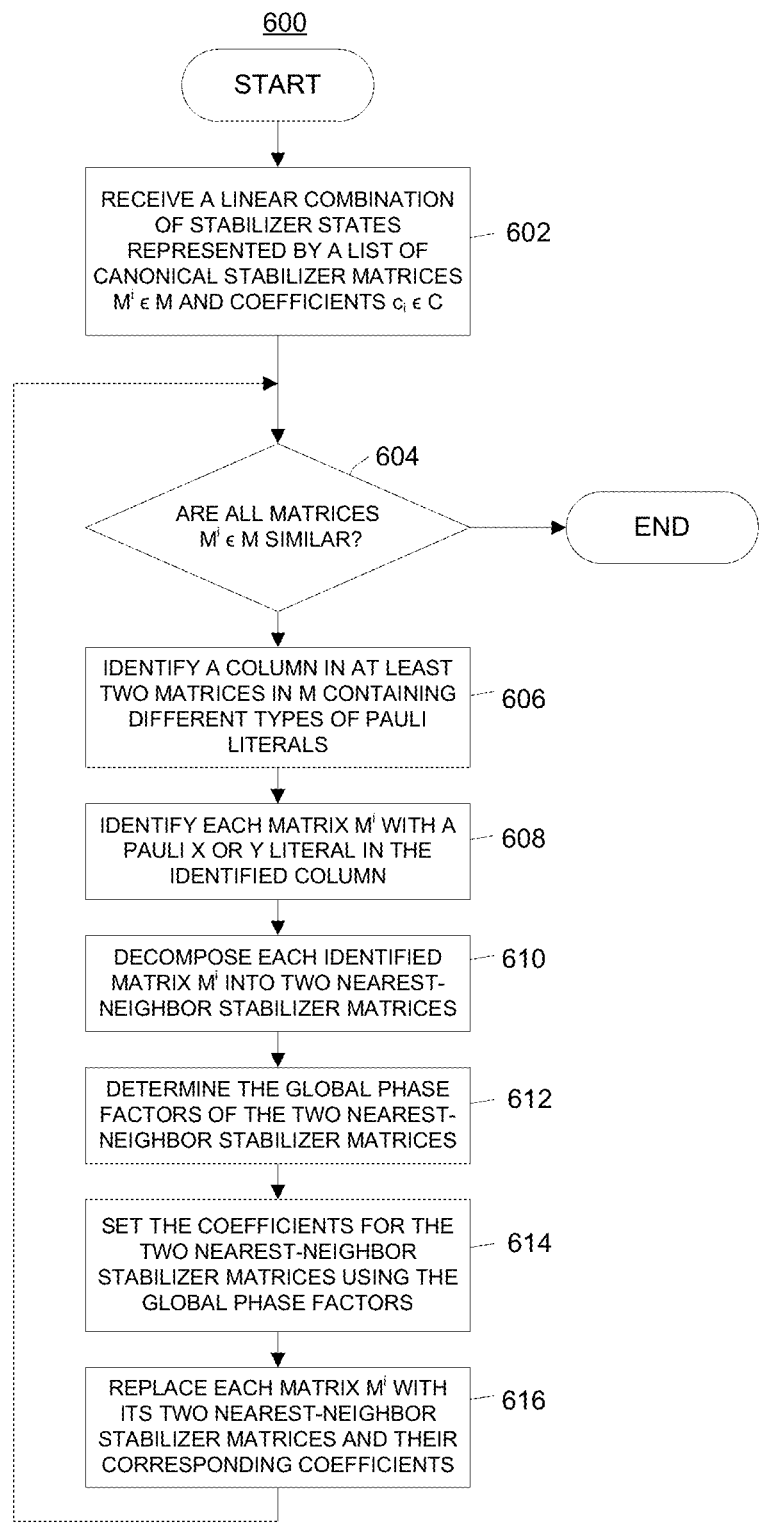
FIG. 6 illustrates a flow diagram of an exemplary orthogonalization method.

Input: Linear combination of n-qubit states |ψ⟩ = $\Sigma_{j=1}^N c_j|\psi_j\rangle$ represented by (i) a list of canonical stabilizer matrices M = {$\mathcal{M}^1$,...,$\mathcal{M}^N$} and (ii) a list of coefficients C = {$c_1$,...,$c_N$}
Output: Modified lists M' and C' representing a linear combination of mutually orthognal states
⇒ PAULI(M,j) returns 0 if the $j^{th}$ column in M has Z literals only (ignores 1 literals), 1 if it has X literals only, 2 if it has Y literals only, 3 if it has X/Z literals only, and 4 if it has Y/Z literals only
⇒ REMOVE(M,C,j) removes the $j^{th}$ element in M and C
⇒ INSERT(M,C,$\mathcal{M}$,c) appends $\mathcal{M}$ to M and c to C if an equivalent matrix does not exist in M: otherwise, sets $c_j$ = $c_j$ + c, where $c_j$ is the coefficient of the matrix in M that is equivalent to $\mathcal{M}$
⇒ DECOMPOSE($\mathcal{M}$,j,a ∈ {0, 1}) implements the proof of Proposition 5.5 and returns the pair [$\mathcal{M}_{j=a}$,α], where $\mathcal{M}_{j=a}$ is the nearest-neighbor canonical matrix with the $j^{th}$ qubit in state |a⟩, and α is the phase factor
1: for j ∈ {1,...,n} do
2:   b ← 0
3:   l ← PAULI($\mathcal{M}^1$, j)
4:   for each $\mathcal{M}^i$, i ∈ {2,...,N} do
5:     k ← PAULI($\mathcal{M}^i$, j)
6:     if k ≠ l or the rows with Pauli literals in the $j^{th}$ column are distinct then
7:       b ← 1
8:       break
9:     end if
10:   end for
11:   if b = 1 then
12:     for each $\mathcal{M}^i$, i ∈ {1,...,N} do
13:       [$\mathcal{M}_{j=0}^i$, α] ← DECOMPOSE($\mathcal{M}^i$, j, 0)
14:       [$\mathcal{M}_{j=1}^i$, β] ← DECOMPOSE($\mathcal{M}^i$, j, 1)
15:       REMOVE(M, C, i)
16:       INSERT(M, C, $\mathcal{M}_{j=0}^i$, α/$\sqrt{2}$)
17:       INSERT(M, C, $\mathcal{M}_{j=1}^i$, β/$\sqrt{2}$)
18:     end for
19:   end if
20: end for FIG. 6 illustrates a flow diagram of an exemplary orthogonalization method 600. The method 600 begins at block 602 with the classical computer receiving a linear combination of stabilizer states represented by a list of stabilizer matrices in canonical form M={$\mathcal{M}^1$, ..., $\mathcal{M}^N$} and (ii) a list of corresponding coefficients C={$c_1$, ..., $c_{iv}$}. In some embodiments the stabilizer states may be represented by one or more frames $\mathcal{F}$ or in another manner, in which case the classical computer may next determine the stabilizer matrices in M and coefficients in C from the linear combination of stabilizer states. Additionally, or alternatively, the stabilizer matrices in M may not be in canonical form, in which case the process described above or other known techniques may be used to put the matrices into canonical form. At block 604, the classical computer determines whether all matrices $\mathcal{M}^i$∈M are similar. As used herein, a plurality of stabilizer matrices are "similar" if the matrices are equivalent up to a phase-vector permutation. The classical computer may determine whether all matrices $\mathcal{M}^i$∈M are similar in a variety of ways, including comparing the matrices by known techniques. Alternatively, an iterative mechanism (e.g., a loop counter) may be used in some embodiments, such as the embodiment in Table V. When all matrices $\mathcal{M}^i$∈M are similar, the method 600 ends. Until all matrices $\mathcal{M}^i$∈M are similar, the classical computer iterates through contained therein or in the rows in which the Pauli literals are located. Once a column j has been identified in block 606, the classical computer may identify one or more matrices $\mathcal{M}^i$∈M containing at least one X or Y Pauli literal in column j. Each matrix $\mathcal{M}^i$∈M is then decomposed into two of its nearest-neighbor stabilizer states at block 610.

Figure 7:
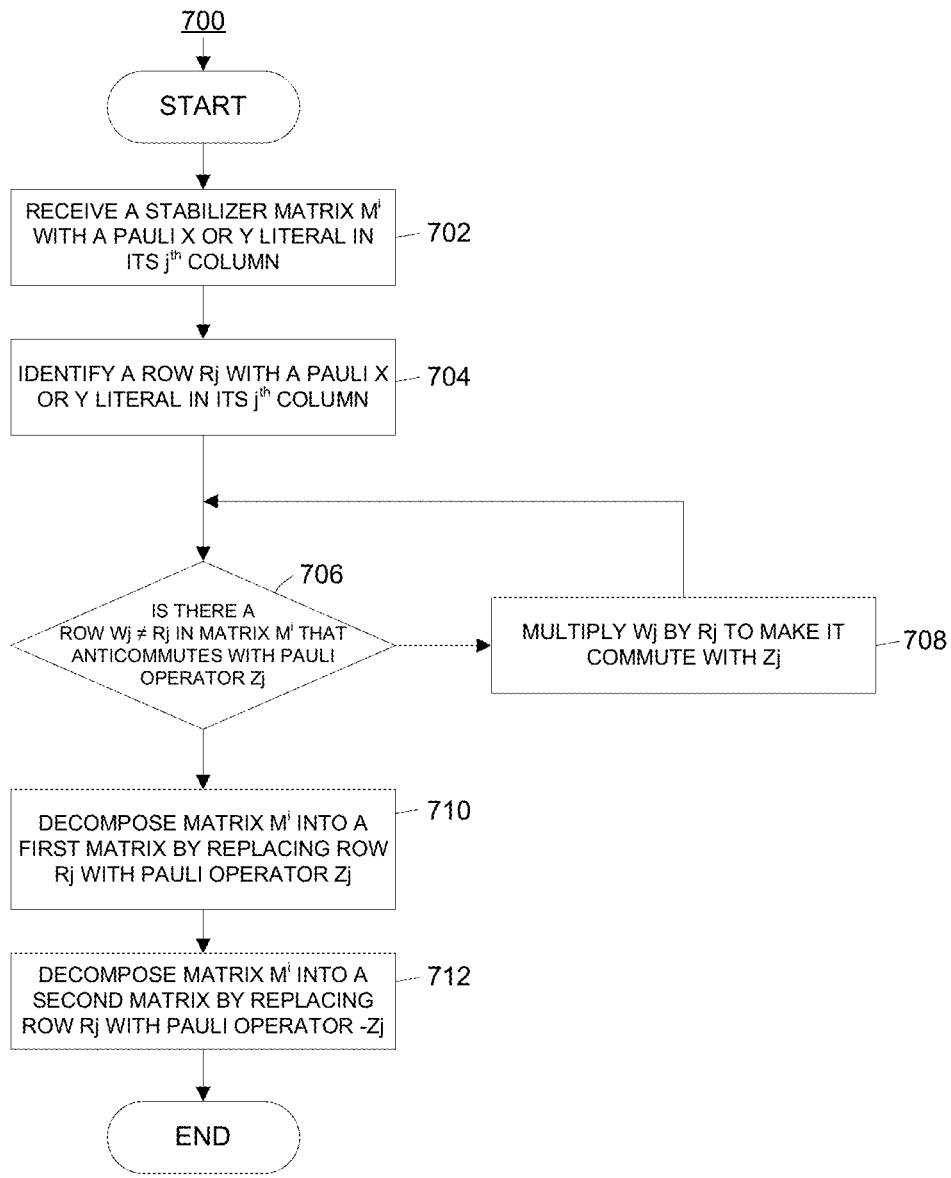
FIG. 7 illustrates a flow diagram of an exemplary decomposition method.

FIG. 7 illustrates a flow diagram of an exemplary decomposition method 700 for decomposing state 10) represented by a matrix $\mathcal{M}^i$∈M with an X or Y Pauli literal in its $j^{th}$ column into its two nearest-neighbor stabilizer states defined by $$\frac{(|\phi\rangle + i^l|\varphi\rangle)}{\sqrt{2}}.$$

At block 702, a stabilizer matrix $\mathcal{M}^i$ with an X or Y literal in its $j^{th}$ column is received. This may be the same matrix identified in block 608 of method 600. At block 704, the classical computer identifies one row $R_j$ within the matrix $\mathcal{M}^i$ with an X or Y literal in its $j^{th}$ column. It should be noted that the row $R_j$ anticommutes with a Pauli operator $Z_j$, which is a row vector containing a Z literal in its $j^{th}$ column and I literals elsewhere. Since the stabilizer matrix $\mathcal{M}^i$ will be decomposed into two nearest neighbors of |ψ⟩ by replacing $R_j$ with $\pm Z_j$, any additional rows $W_j \neq R_j$ in $\mathcal{M}^i$ containing an X or Y literal in their $j^{th}$ columns may be made to commute with $Z_j$ by multiplication by $R_j$. Thus, at block 706, the classical computer determines whether there is another row $W_j \neq R_j$ in matrix $\mathcal{M}^i$ that anticommutes with Pauli operator $Z_j$. Where such a row is found, the classical computer multiplies the row $W_j$ by the row $R_j$ to make it commute with the Pauli operator $Z_j$. Block 706 and 708 are repeated until no further rows $W_j$ are found, at which point the matrix $\mathcal{M}^i$ is decomposed into two matrices representing orthogonal nearest-neighbor stabilizer states of $|\psi\rangle$. At block 710, the classical computer decomposes the matrix $\mathcal{M}^i \in M$ into a first matrix $\mathcal{M}^\Phi$ by replacing the row $R_j$ with $Z_j$. At block 712, the classical computer similarly decomposes the matrix $\mathcal{M}^i$ into a second matrix $\mathcal{M}^\phi$ by replacing the row $R_j$ with the row $-Z_j$. The steps implemented at blocks 710 and 712 are equivalent to applying $\pm Z_j$-measurement projectors to $|\psi\rangle$. Thus, the first matrix $\mathcal{M}^\Phi$ and the second matrix $\mathcal{M}^\phi$ represent the nearest-neighbor stabilizer states $$|\phi\rangle = \frac{(I + Z_j)|\psi\rangle}{\sqrt{2}}$$

and $$|\varphi\rangle = \frac{(I - Z_j)|\psi\rangle}{\sqrt{2}}.$$

It should be noted that the first and second matrices $\mathcal{M}^\Phi$ and $\mathcal{M}^\phi$ are similar and that $$|\langle \psi | \phi \rangle| = |\langle \psi | \varphi \rangle| = \frac{1}{\sqrt{2}},$$

so the first and second matrices $\mathcal{M}^\Phi$ and $\mathcal{M}^\phi$ are orthogonal. Additionally, the $j^{th}$ qubits in $|\Phi\rangle$ and $|\phi\rangle$ are deterministic with states $|0\rangle$ and $|1\rangle$, respectively. Thus, the state $|\psi\rangle$ represented by matrix $\mathcal{M}^i$ has been decomposed into orthogonal stabilizer states $|\Phi\rangle$ and $|\phi\rangle$ represented by the first and second matrices $\mathcal{M}^\Phi$ and $\mathcal{M}^\phi$, respectively. From the discussion above, $$\frac{(|\phi\rangle + i^l|\varphi\rangle)}{\sqrt{2}}$$

represents a nearest-neighbor decomposition of $|\psi\rangle$. To fully represent $|\psi\rangle$ by its decomposition, the global phase factor $i^l$ is needed.

Returning to FIG. 6, at block 612, the global phase factors $\alpha$ and $\beta$ of the first and second matrices $\mathcal{M}^\Phi$ and $\mathcal{M}^\phi$, respectively, are determined using the procedure described in the global phase maintenance method 500 as applied to the matrix $\mathcal{M}^i$ and coefficient $c_i$. At block 614, the classical computer sets the coefficients $c_\Phi \in C$ and $c_\phi \in C$ of the first and second matrices $\mathcal{M}^\Phi$ and $\mathcal{M}^\phi$ as $$c_\phi = \frac{\gamma}{\sqrt{2}}$$

and $$c_\phi = \frac{\beta}{\sqrt{2}}.$$

At block 016, the classical computer replaces the matrix $\mathcal{M}^i \in M$ and $c_i \in C$ with the first and second matrices $\mathcal{M}^\Phi$ and $\mathcal{M}^\phi$ and their respective coefficients $c_\Phi$ and $c_\phi$. In some embodiments, the classical computer may determine whether either or both of the first and second matrices $\mathcal{M}^\Phi$ and $\mathcal{M}^\phi$ are equivalent to existing matrices $\mathcal{M}^p \in M$ and $\mathcal{M}^q \in M$, respectively. If equivalent matrices $\mathcal{M}^p$ or $\mathcal{M}^q$ are found, then the classical computer may set the coefficients $c_p = c_p + c_\Phi$ and $c_q = c_q + c_\phi$. Where either the first matrix $\mathcal{M}^\Phi$ or the second matrix or $\mathcal{M}^\phi$ is not equivalent to any matrix in M, then the first matrix $\mathcal{M}^\Phi$ or the second matrix or $\mathcal{M}^\phi$ is added to M and the respective coefficient $c_\Phi$ or $c_\phi$ is added to C. Once all matrices in M are determined at block 604 to be similar (and, therefore, orthogonal), the method 600 terminates.

Multiframe Simulation

Although a single frame $\mathcal{F}$ is sufficient to represent a stabilizer-state superposition $|\Psi\rangle$, it is possible to tame the exponential growth of states in $|\Psi\rangle$ in some circumstances by admitting a multiframe representation. A multiframe representation reduces the total number of states required to represent $|\Psi\rangle$ by at least half, thus improving the scalability of our technique. For example, in simulations of ripple-carry adders, the number of states in $|\Psi\rangle$ grows linearly when multiframes are used but exponentially when a single frame is used. We derive a multiframe representation directly from a single frame $\mathcal{F}$ by examining the set of phase vectors and identifying candidate pairs that can be coalesced into a single phase vector associated with a different stabilizer matrix $\mathcal{M}$. We maintain the stabilizer matrix $\mathcal{M}$ of frame $\mathcal{F}$ in row-echelon form, so examining the phases corresponding to $Z_j$ rows (i.e., rows with a Z literal in the $i^{th}$ column and I literals elsewhere allows us to identify the columns in $\mathcal{M}$ that must be modified in order to coalesce candidate pairs.

Figure 8:
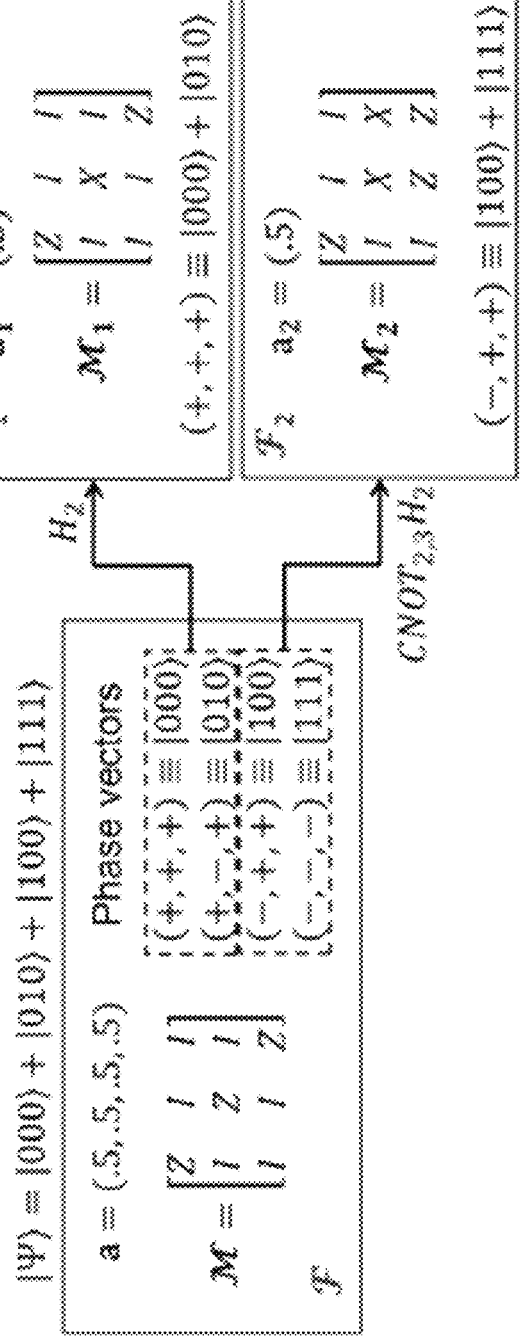
FIG. 8 illustrates an exemplary multiframe representation of a quantum state.

FIG. 8 illustrates an exemplary multiframe representation of a state $|\Psi\rangle = |000\rangle + |010\rangle + |100\rangle + |100\rangle$. The stabilizer matrix $\mathcal{M}^1$ is obtained from stabilizer matrix $\mathcal{M}$ by conjugating the first column of $\mathcal{M}$ by an H gate. The stabilizer matrix $\mathcal{M}^2$ is obtained from stabilizer matrix $\mathcal{M}$ by first conjugating the first column of $\mathcal{M}$ by an H gate, then conjugating the first and third columns of modified $\mathcal{M}$ by a CNOT gate. The output of this coalescing process is a list of frames $\mathcal{F}_1$ and $\mathcal{F}_1$ that together represent the same superposition as the original frame $\mathcal{F}$. To facilitate quantum measurements on multiframes as the sum of normalized outcome probabilities as discussed above, we require that the stabilizer frames that represent a superposition of stabilizer states remain mutually orthogonal during simulation. Orthogonality may be maintained by selecting only candidate pairs such that the new frames generated from the set of coalesced phase vectors are mutually orthogonal. Generally, a pair of phase vectors $\langle \sigma_r | \sigma_j \rangle$ from the same n-qubit frame $\mathcal{F}$ is a candidate pair if and only if (i) $\sigma_r$ and $\sigma_j$ are equal up to m≤n entries corresponding to $Z_k$ rows (where k is the qubit the row stabilizes) and (ii) the amplitudes of the global phases $\alpha_r$ and $\alpha_j$ corresponding to phase vectors $\sigma_r$ and $\sigma_j$, respectively, are equivalent up to a phase, i.e., $\alpha_r = i^d \alpha_j$ for some $\{d \in \{0, 1, 2, 3\}\}$. The stabilizer circuit needed to coalesce a candidate pair $\langle \sigma_r | \sigma_j \rangle$ with m different entries can be defined as $C = CNOT_{v_1 v_2} CNOT_{v_1 v_3} \ldots CNOT_{v_1 v_m} R_{V_1}{}^d H_{v_1}$ where each $v_k \in v = \{v_1, v_2, \ldots, v_m\}$ designates the qubit stabilized by the m different entries in the candidate pair $\langle \sigma_r | \sigma_j \rangle$.

To coalesce the candidate pairs of the frame $\mathcal{F}$ into a multiframe representation, the phase vectors $\sigma_i$ are sorted such that candidate pairs $\langle \sigma_r | \sigma_j \rangle$ are positioned next to each other. Then, the following two steps are repeated until no candidate pairs remain. First, coalesce candidate pairs into a new set of phase vectors $\sigma'$. Next, create a new frame $\mathcal{F}'$ consisting of the phase vectors $\sigma'$ and the stabilizer matrix $C\mathcal{M}C\dagger$. The output of this coalescing procedure is a list of n-qubit frame $\mathcal{F} = \{\mathcal{F}'_1, \mathcal{F}'_2, \ldots, \mathcal{F}'_s\}$ that together represent the same superposition as the original input frame $\mathcal{F}$. The runtime of the coalescing procedure is dominated by the sorting of the phase vectors, where each phase-vector comparison takes $\Theta(n)$ time. Therefore, the overall run time is $O(nk \log k)$ in the worst case for a single frame $\mathcal{F}$ with k phase vectors.

To simulate stabilizer, TOF, controlled-R($\alpha$), and measurement gates using multiframes, the single-frame operations are applied to each frame separately as discussed above. For TOF and controlled-R($\alpha$) gates, the following additional steps may be required. First, apply the coalescing procedure to each frame and insert the newly coalesced frames into the list $\mathcal{F}'$. Second, merge frames in $\mathcal{F}'$ with equivalent stabilizer matrices $\mathcal{M}$. Then, repeat the first and second steps until no new frames are generated.

Parallel Simulation Using Frames

Unlike other techniques based on compact representations of quantum states, the frame-based operations described herein lend themselves to multi-threaded implementation for parallel simulation. Only the orthogonalization procedure creates a bottleneck by requiring operations involving multiple frames. The other processes and methods described above may be implemented by one or more processors of a classical computer executing instructions pertaining to one of a number of frames or phase vectors. Thus, the efficiency of processing and memory usage of the classical computer system may be further improved by the following methods.

Figure 9:
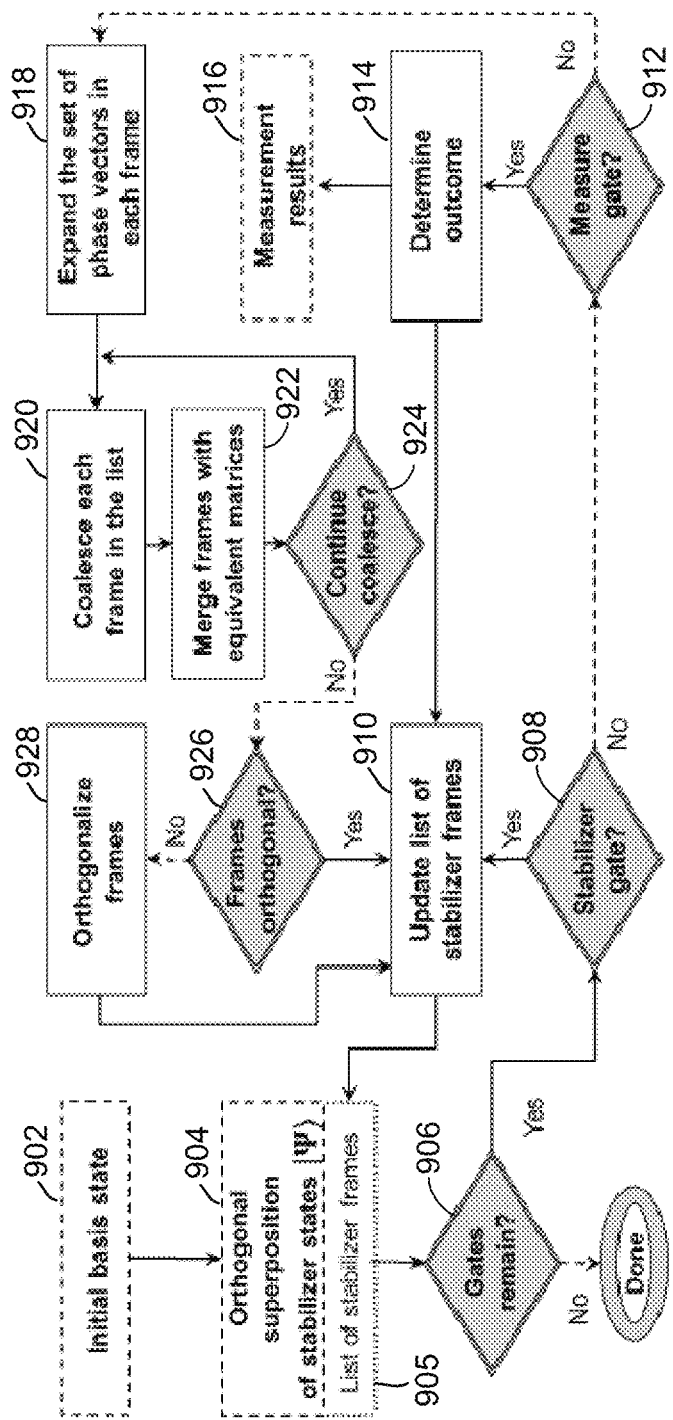
FIG. 9 illustrates a flow diagram of an exemplary parallel simulation method.

FIG. 9 illustrates a flow diagram of an exemplary parallel simulation method 900. The method 900 begins at block 902, where the initial basis state $|\psi\rangle$ is received by the classical computer. In some embodiments, the initial basis state $|\psi\rangle$ may consist of one or more of a deterministic vector of qubits (e.g., $|00 \ldots 0\rangle$), a phase vector $\sigma$, a stabilizer matrix $\mathcal{M}$, or a frame $\mathcal{F}$. The initial basis state $|\psi\rangle$ is decomposed into an orthogonal superposition of stabilizer states $|\Psi\rangle$ at block 904 to obtain a stabilizer frame $\mathcal{F}$, using the techniques described above. In some embodiments, the stabilizer frame $\mathcal{F}$ may also be divided into a list of stabilizer frames $\mathcal{F} = \{\mathcal{F}'_1, \mathcal{F}'_2, \ldots, \mathcal{F}'_s\}$ and stored as input to the iterative simulation process at block 905. The remainder of the method 900 is then implemented by the classical computer to iteratively apply a quantum circuit C including a number of quantum gates U E C to the list of stabilizer frames $\mathcal{F} = \{\mathcal{F}'_1, \mathcal{F}'_2, \ldots, \mathcal{F}'_s\}$ in block 905. At block 906, the classical computer determines whether any gates U∈C remain to be simulated. While at least one gate U remains, the classical computer determines whether the gate U is a stabilizer gate (e.g., H, R, or CNOT) at block 908. If gate U is a stabilizer gate, then the gate is applied to all frames in $\mathcal{F}$ and the list of stabilizer frames $\mathcal{F} = \{\mathcal{F}'_1, \mathcal{F}'_2, \ldots, \mathcal{F}'_s\}$ is updated at block 910. The updated list of stabilizer frames may then be stored at block 905 and used as the input in the next iteration of the process. If gate U is not a stabilizer gate, then the classical computer determines whether the gate U is a measurement gate at block 912. Where gate U is a measurement gate, the classical computer determines the outcome state at block 912 and may record the measurement results at block 916. In some embodiments, a random number generator or other known methods of sampling a random distribution to determine a discrete outcome from a probability distribution may be used to determine a discrete outcome at block 914, as discussed above. After determining the outcome state at block 914, the results of measurement may be used to update the list of stabilizer frames at block 910.

Where the gate U is neither a stabilizer gate nor a measurement gate, the iteration continues by applying the gate U to each frame in the list of stabilizer frames at block 918 using the frame-based simulation techniques discussed above, expanding the set of phase vectors in each frame in $\mathcal{F}$. The global phase may be maintained during simulation of non-stabilizer gates (e.g, Toffoli or controlled-R($\alpha$) gates) using the techniques discussed with respect to method 500. Following application of the gate U to each frame, candidate pairs of phase vectors $\sigma$ in each frame in the list are coalesced into new frames at block 920. Frames with equivalent matrices are then merged to eliminate redundancies at block 922. The classical computer may then determine whether to continue the coalescing procedure at block 924 by determining whether any candidate pairs remain, as discussed above. When all frames in $\mathcal{F}$ have been coalesced, the classical computer next determines whether the frames in $\mathcal{F}$ are orthogonal at block 926. Orthogonality of the stabilizer matrices $\mathcal{M}^i \in M$ corresponding to the frames $\mathcal{F}_i$ in $\mathcal{F}$ may be determined using known methods (e.g., inner product computation). In some embodiments, the canonical structure of the stabilizer matrices in $\mathcal{M}$ may be used to reduce the number of matrix comparisons required. Where the set P of Pauli operators that form the intersection of rows across matrices in M is non-empty, the orthogonality of any two matrices in M may be determined by checking whether the phase vector entries corresponding to the set P of Pauli operators that form the intersection of rows across two matrices are different. Where the frames are determined not to be orthogonal, they can be made orthogonal using the orthogonalization method 600 described above. Once all frames are orthogonal, the list of stabilizer frames $\mathcal{F} = \{\mathcal{F}'_1, \mathcal{F}'_2, \ldots, \mathcal{F}'_s\}$ is updated at block 910. When no gates remain to be applied at block 906, the method 900 terminates.

Implementation Using a Classical Computer

The preceding methods are designed to be implemented by a classical computer to simulate the operation of a quantum computer, which is advantageous in the design and testing of quantum circuits and algorithms. The matrix, vector, and logic operations discussed herein may be performed on a classical computer, including specialized computing systems or commercially available personal computers, laptop computers, servers, or mainframes. The operations performed by the classical computer may also be performed by a program or programs implemented on one or more computers. In some embodiments, some or all of the operations may be performed by more than one computer communicatively connected through a network.

Figure 10:
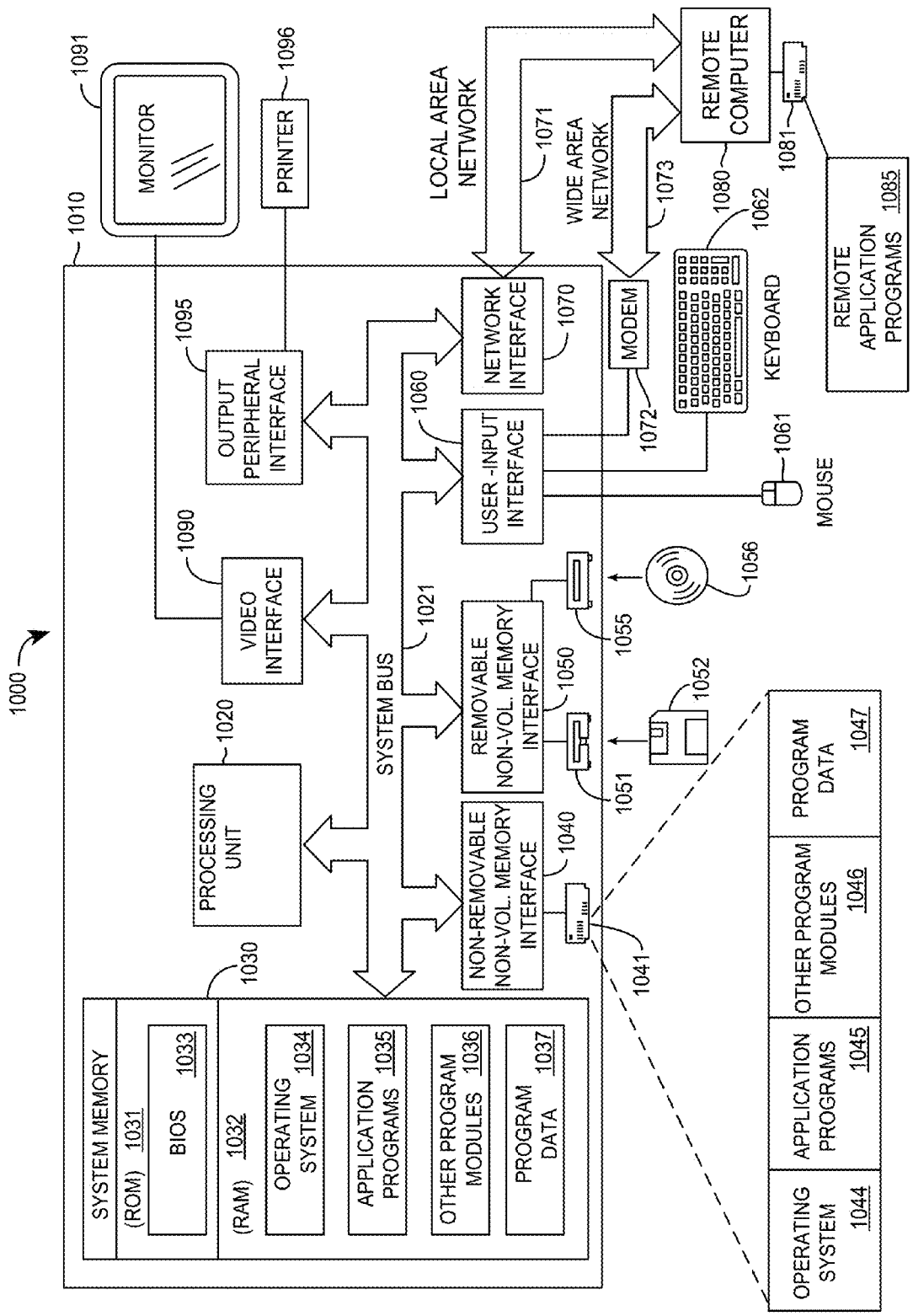
FIG. 10 illustrates an exemplary block diagram of a computer system on which the methods and techniques described herein may be implemented in accordance with the described embodiments.

FIG. 10 illustrates an exemplary block diagram of a computer system 1000 on which the methods and techniques described herein may be implemented in accordance with the described embodiments. The computer system 1000 includes a computing device in the form of a computer 1010. Components of the computer 1010 may include, but are not limited to, a processing unit 1020, a system memory 1030, and a system bus 1021 that couples various system components including the system memory to the processing unit 1020. The system bus 1021 may be any of several types of bus structures including a memory bus or memory controller, a peripheral bus, and a local bus using any of a variety of bus architectures. By way of example, and not limitation, such architectures include the Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 1010 typically includes a variety of computer readable media. Computer readable media can be any available media that can be accessed by computer 1010 and includes both transitory and non-transitory media, and both removable and non-removable media. By way of example, and not limitation, computer readable media may include non-transitory computer storage media. Computer storage media includes volatile and nonvolatile, removable and non-removable media implemented in any method or technology for storage of information such as computer readable instructions, data structures, program modules, or other data. Non-transitory computer storage media includes, but is not limited to, RAM, ROM, EEPROM, FLASH memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 1010.

The system memory 1030 includes computer storage media in the form of volatile and/or nonvolatile memory such as read only memory (ROM) 1031 and random access memory (RAM) 1032. A basic input/output system 1033 (BIOS), containing the basic routines that help to transfer information between elements within computer 1010, such as during start-up, is typically stored in ROM 1031. RAM 1032 typically contains data and/or program modules that are immediately accessible to and/or presently being operated on by processing unit 1020. By way of example, and not limitation, FIG. 10 illustrates operating system 1034, application programs 1035, other program modules 1036, and program data 1037.

The computer 1010 may also include other removable or non-removable, volatile or nonvolatile computer storage media. By way of example only, FIG. 10 illustrates a hard disk drive 1041 that reads from or writes to non-removable, nonvolatile magnetic media, a magnetic disk drive 1051 that reads from or writes to a removable, nonvolatile magnetic disk 1052, and an optical disk drive 1055 that reads from or writes to a removable, nonvolatile optical disk 1056 such as a CD ROM or other optical media. Other removable or non-removable, volatile or nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 1041 is typically connected to the system bus 1021 through a non-removable memory interface such as interface 1040, and magnetic disk drive 1051 and optical disk drive 1055 are typically connected to the system bus 1021 by a removable memory interface, such as interface 1050.

The drives and their associated computer storage media discussed above and illustrated in FIG. 10 provide storage of computer readable instructions, data structures, program modules and other data for the computer 1010. In FIG. 10, for example, hard disk drive 1041 is illustrated as storing operating system 1044, application programs 1045, other program modules 1046, and program data 1047. Note that these components can either be the same as or different from operating system 1034, application programs 1035, other program modules 1036, and program data 1037. Operating system 1044, application programs 1045, other program modules 1046, and program data 1047 are given different numbers here to illustrate that, at a minimum, they are different copies. A user may enter commands and information into the computer 1010 through input devices such as a keyboard 1062 and cursor control device 1061, commonly referred to as a mouse, trackball or touch pad. A monitor 1091 or other type of display device is also connected to the system bus 1021 via an interface, such as a graphics controller 1090. In addition to the monitor, computers may also include other peripheral output devices such as printer 1096, which may be connected through an output peripheral interface 1095.

The computer 1010 may operate in a networked environment using logical connections to one or more remote computers, such as a remote computer 1080. The remote computer 1080 may be a personal computer, a server, a router, a network PC, a peer device or other common network node, and typically includes many or all of the elements described above relative to the computer 1010, although only a memory storage device 1081 has been illustrated in FIG. 10. The logical connections depicted in FIG. 10 include a local area network (LAN) 1071 and a wide area network (WAN) 1073, but may also include other networks.

When used in a LAN networking environment, the computer 1010 is connected to the LAN 1071 through a network interface or adapter 1070. When used in a WAN networking environment, the computer 1010 typically includes a modem 1072 or other means for establishing communications over the WAN 1073, such as the Internet. The modem 1072, which may be internal or external, may be connected to the system bus 1021 via the input interface 1060, or other appropriate mechanism. In a networked environment, program modules depicted relative to the computer 1010, or portions thereof, may be stored in the remote memory storage device 1081. By way of example, and not limitation, FIG. 10 illustrates remote application programs 1085 as residing on memory device 1081.

The communications connections 1070, 1072 allow the device to communicate with other devices. The communications connections 1070, 1072 are an example of communication media. The communication media typically embodies computer readable instructions, data structures, program modules or other data in a modulated data signal such as a carrier wave or other transport mechanism and includes any information delivery media. A "modulated data signal" may be a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media.

Throughout this specification, plural instances may implement components, operations, or structures described as a single instance. Although individual operations of one or more methods are illustrated and described as separate operations, one or more of the individual operations may be performed concurrently, and may, where appropriate, be performed in an order other than the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules. Although the term "processor" may include central processing units (CPUs), it may also include equivalent general or special-purpose circuits, such as field programmable gate arrays (FPGAs) or graphics processing units (GPUs).

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location, while in other embodiments the processors may be distributed across a number of locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

This detailed description is to be construed as exemplary only and does not describe every possible embodiment, as describing every possible embodiment would be impractical, if not impossible. One could implement numerous alternate embodiments, using either current technology or technology developed after the filing date of this application.

Upon reading this disclosure, those of skill in the art will appreciate still additional alternative structural and functional designs for system and a method for assigning mobile device data to a vehicle through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

The particular features, structures, or characteristics of any specific embodiment may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention. By way of example, and not limitation, the present disclosure contemplates at least the following aspects:

1. A method for maintaining global phases to improve processing efficiency or reduce memory usage during simulation of at least one quantum gate of a quantum computer using a classical computer, the method comprising: receiving, at a processor of the classical computer, a quantum state that is a superposition of a plurality of stabilizer states, wherein the quantum state is represented by a stabilizer matrix associated with the plurality of stabilizer states, a plurality of phase vectors representing each of the stabilizer states, and an amplitude vector, wherein each entry in the amplitude vector represents a global phase associated with one of the plurality of phase vectors; receiving, at a processor of the classical computer, a matrix representation of the at least one quantum gate; and determining, by a processor of the classical computer, the effect of the at least one quantum gate on the quantum state in a plurality of iterations, each iteration including: applying, by a processor of the classical computer, one of the plurality of phase vectors to the stabilizer matrix; determining, by a processor of the classical computer, an input basis state associated with the one phase vector applied to the stabilizer matrix; determining, by a processor of the classical computer, an input non-zero amplitude associated with the input basis state; determining, by a processor of the classical computer, a first output non-zero amplitude associated with an output basis state by applying the matrix representation of the at least one quantum gate to the input non-zero amplitude and the input basis state; determining, by a processor of the classical computer, a second output non-zero amplitude of the output basis state using the stabilizer matrix and the matrix representation of the at least one quantum gate; and adjusting, by a processor of the classical computer, the entry in the amplitude vector associated with the one phase vector applied to the stabilizer matrix, wherein the entry is adjusted proportionally to the first output non-zero amplitude and the second output non-zero amplitude.

2. The method according to aspect 1, wherein at least one quantum gate of the quantum computer is not a stabilizer gate.

3. The method according to either of aspect 1 or aspect 2, wherein a set of the quantum gates form a universal set for quantum computation.

4. The method according to any one of the preceding aspects, wherein the stabilizer matrix is in canonical form.

5. The method according to any one of the preceding aspects, wherein: receiving the quantum state that is a superposition of the plurality of stabilizer states further comprises compressing, by a processor of the classical computer, the quantum state into a stabilizer frame representing the quantum state, wherein the stabilizer frame includes the stabilizer matrix, the plurality of phase vectors, and the amplitude vector, and the method further comprises determining, by a processor of the classical computer, the effect of a plurality of the quantum gates on the quantum state using the stabilizer frame without uncompressing the stabilizer frame for measurement until the plurality of quantum gates have been applied to the quantum state.

6. A tangible, non-transitory computer-readable medium storing instructions for maintaining global phases to improve processing efficiency or reduce memory usage during simulation of at least one quantum gate of a quantum computer using a classical computer that, when executed by one or more processors of the classical computer, cause the classical computer to: receive a quantum state that is a superposition of a plurality of stabilizer states, wherein the quantum state is represented by a stabilizer matrix associated with the plurality of stabilizer states, a plurality of phase vectors representing each of the stabilizer states, and an amplitude vector, wherein each entry in the amplitude vector represents a global phase associated with one of the plurality of phase vectors; receive a matrix representation of the at least one quantum gate; and determine the effect of the at least one quantum gate on the quantum state in a plurality of iterations, each iteration including instructions to: apply one of the plurality of phase vectors to the stabilizer matrix; determine an input basis state associated with the one phase vector applied to the stabilizer matrix; determine an input non-zero amplitude associated with the input basis state; determine a first output non-zero amplitude associated with an output basis state by applying the matrix representation of the at least one quantum gate to the input non-zero amplitude and the input basis state; determine a second output non-zero amplitude of the output basis state using the stabilizer matrix and the matrix representation of the at least one quantum gate; and adjust the entry in the amplitude vector associated with the one phase vector applied to the stabilizer matrix, wherein the entry is adjusted proportionally to the first output non-zero amplitude and the second output non-zero amplitude.

7. The tangible, non-transitory computer-readable medium according to aspect 6, wherein at least one quantum gate of the quantum computer is not a stabilizer gate.

8. The tangible, non-transitory computer-readable medium according to either of aspect 6 or aspect 7, wherein the stabilizer matrix is in reduced row-echelon form.

9. The tangible, non-transitory computer-readable medium according to any one of aspects 6-8, wherein the executable instructions that when executed by the one or more processors cause the classical computer to receive the quantum state that is a superposition of the plurality of stabilizer states further comprise executable instructions that when executed by the one or more processors cause the classical computer to compress the quantum state into a stabilizer frame representing the quantum state, wherein the stabilizer frame includes the stabilizer matrix, the plurality of phase vectors, and the amplitude vector; and further comprising executable instructions that when executed by the one or more processors cause the classical computer to determine the effect of a plurality of the quantum gates on the quantum state using the stabilizer frame without uncompressing the stabilizer frame for measurement until the plurality of quantum gates have been applied to the quantum state.

10. The tangible, non-transitory computer-readable medium according to any one of aspects 6-9, wherein the stabilizer frame further comprises a linear combination of a plurality of mutually orthogonal stabilizer frames.

11. A method for orthogonalization of a linear combination of stabilizer states to improve processing efficiency or reduce memory usage during simulation of a quantum circuit using a classical computer, the method comprising: receiving, at a processor of the classical computer, a linear combination of stabilizer states, wherein the linear combination includes a plurality of stabilizer states represented by canonical stabilizer matrices and a plurality of coefficients associated with the plurality of stabilizer states; and orthogonalizing, by a processor of the classical computer, the linear combination of stabilizer states in each of one or more iterations, including: identifying, by a processor of the classical computer, a column in which at least two of the canonical stabilizer matrices contain different types of Pauli literals; decomposing, by a processor of the classical computer, each of the stabilizer matrices that contain an X or Y Pauli literal in the identified column into a first matrix and a second matrix, wherein the first matrix and the second matrix represent stabilizer states that are nearest neighbors of the stabilizer state associated with the decomposed stabilizer matrix; determining, by a processor of the classical computer, a first global phase factor of the first matrix and a second global phase factor of the second matrix associated with each of the decomposed stabilizer matrices; and replacing, by a processor of the classical computer, each of the decomposed stabilizer matrices and their associated coefficients with (i) the first matrix and a first coefficient proportionate to the first global phase factor associated with the decomposed stabilizer matrix and (ii) the second matrix and a second coefficient proportionate to the second global phase factor associated with the decomposed stabilizer matrix.

12. The method according to aspect 11, wherein: at least one of the quantum gates is a measurement gate, and determining the effect of the measurement gate comprises determining, by a processor of the classical computer, an outcome probability of a state using normalized outcome probabilities of the state in each of the frames.

13. The method according to either of aspect 11 or aspect 12, wherein: at least one of the quantum gates is a measurement gate, and determining the effect of the measurement gate comprises determining, using a processor of the classical computer, an outcome probability of a state using normalized outcome probabilities of the state in each of the frames.

14. The method according to any one of aspects 11-13, wherein the method is implemented in parallel on at least two groups, with each of the groups containing at least one of the stabilizer frames.

15. The method according to any one of aspects 11-14, wherein at least one of the quantum gates is not a stabilizer gate.

16. A tangible, non-transitory computer-readable medium storing instructions for orthogonalization of a linear combination of stabilizer states to improve processing efficiency or reduce memory usage during simulation of a quantum circuit using a classical computer that, when executed by one or more processors of the classical computer, cause the classical computer to: receive a linear combination of stabilizer states, wherein the linear combination includes a plurality of stabilizer states represented by canonical stabilizer matrices and a plurality of coefficients associated with the plurality of stabilizer states; and orthogonalize the linear combination of stabilizer states in each of one or more iterations, including instructions to: identify a column in which at least two of the canonical stabilizer matrices contain different types of Pauli literals; decompose each of the stabilizer matrices that contain an X or Y Pauli literal in the identified column into a first matrix and a second matrix, wherein the first matrix and the second matrix represent stabilizer states that are nearest neighbors of the stabilizer state associated with the decomposed stabilizer matrix; determine a first global phase factor of the first matrix and a second global phase factor of the second matrix associated with each of the decomposed stabilizer matrices; and replace each of the decomposed stabilizer matrices and their associated coefficients with (i) the first matrix and a first coefficient proportionate to the first global phase factor associated with the decomposed stabilizer matrix and (ii) the second matrix and a second coefficient proportionate to the second global phase factor associated with the decomposed stabilizer matrix.

17. The tangible, non-transitory computer-readable medium according to aspect 16, wherein the instructions to decompose each of the stabilizer matrices further comprise instructions to (i) identify a row in the stabilizer matrix that contains an X or Y Pauli literal in the identified column, (ii) cause every other row in the stabilizer matrix that commutes with the identified row to anticommute with the identified row, (iii) create the first matrix from the revised stabilizer matrix by replacing the row with a first new row containing a positive Z Pauli literal in the identified column, and (iv) create the second matrix from the revised stabilizer matrix by replacing the row with a second new row containing a negative Z Pauli literal in the identified column.

18. The tangible, non-transitory computer-readable medium according to either of aspect 16 or aspect 17, wherein the linear combination of stabilizer states comprises a linear combination of stabilizer frames representing a quantum state, and further comprising executable instructions that when executed by the one or more processors cause the classical computer to determine the effect of at least one quantum gate on the linear combination of stabilizer states by applying a matrix representation of the quantum gate to each of the stabilizer frames.

19. The tangible, non-transitory computer-readable medium according to any one of aspects 16-18, wherein at least one of the quantum gates is a measurement gate, and the executable instructions that when executed by the one or more processors cause the classical computer to determine the effect of at least one quantum gate on the linear combination of stabilizer states further comprise executable instructions that when executed by the one or more processors cause the classical computer to determine an outcome probability of a state using normalized outcome probabilities of the state in each of the frames.

20. The tangible, non-transitory computer-readable medium according to any one of aspects 16-19, wherein at least one of the quantum gates is not a stabilizer gate.

What is claimed is:

1. A method for simulating quantum computation on a classical computer by maintaining global phases during simulation of at least one quantum gate of a quantum computer using the classical computer, the method comprising:

receiving, at a processor of the classical computer, a quantum state that is a superposition of a plurality of stabilizer states, wherein the quantum state is represented by (i) a stabilizer matrix associated with the plurality of stabilizer states, (ii) a plurality of phase vectors representing each of the stabilizer states, and (iii) an amplitude vector, wherein each entry in the amplitude vector represents a global phase of one of the plurality of stabilizer states represented by one of one of the plurality of phase vectors;

receiving, at a processor of the classical computer, a matrix representation of the at least one quantum gate; and determining, by a processor of the classical computer, the effect of the at least one quantum gate on the quantum state in a plurality of iterations, each iteration associated with a phase vector of the plurality of phase vectors and including:

applying, by a processor of the classical computer, the phase vector to the stabilizer matrix by setting leading phases of the stabilizer matrix to values of entries in the phase vector;

determining, by a processor of the classical computer, an input basis state associated with the phase vector applied to the stabilizer matrix based upon the entries in the phase vector and corresponding literals in the stabilizer matrix;

determining, by a processor of the classical computer, an input non-zero amplitude of the input basis state by Gaussian elimination or sampling of values of the stabilizer matrix;

applying, by a processor of the classical computer, the matrix representation of the at least one quantum gate to the input non-zero amplitude and the input basis state by matrix-vector multiplication to obtain an output basis state and a first output non-zero amplitude associated with the output basis state;

determining, by a processor of the classical computer, a second output non-zero amplitude of the output basis state from the result of matrix multiplication of the matrix representation of the at least one quantum gate, the stabilizer matrix, and the conjugate transpose of the matrix representation of the at least one quantum gate; and adjusting, by a processor of the classical computer, the entry in the amplitude vector associated with the phase vector applied to the stabilizer matrix to maintain the global phase associated with the phase vector, wherein the entry is adjusted by multiplying the entry by a proportion of the first output non-zero amplitude to the second output non-zero amplitude; and determining, by a processor of the classical computer, a resulting quantum state using the adjusted amplitude vector.

2. The method of claim 1, wherein at least one quantum gate of the quantum computer is not a stabilizer gate.

3. The method of claim 1, wherein a set of the quantum gates form a universal set for quantum computation.

4. The method of claim 1, wherein the stabilizer matrix is in canonical form.

5. The method of claim 1, wherein:

receiving the quantum state that is a superposition of the plurality of stabilizer states further comprises generating, by a processor of the classical computer, a stabilizer frame representing the quantum state as a superposition of orthogonal stabilizer states, wherein the stabilizer frame includes the stabilizer matrix, the plurality of phase vectors, and the amplitude vector, and the method further comprises determining, by a processor of the classical computer, an additional effect of a plurality of additional quantum gates on the quantum state using the stabilizer frame by sequentially applying the plurality of additional quantum gates to the stabilizer frame before measuring the resulting quantum state.

6. A tangible, non-transitory computer-readable medium storing instructions for simulating quantum computation on a classical computer by maintaining global phases during simulation of at least one quantum gate of a quantum computer using the classical computer that, when executed by one or more processors of the classical computer, cause the classical computer to:

receive a quantum state that is a superposition of a plurality of stabilizer states, wherein the quantum state is represented by (i) a stabilizer matrix associated with the plurality of stabilizer states, (ii) a plurality of phase vectors representing each of the stabilizer states, and (iii) an amplitude vector, wherein each entry in the amplitude vector represents a global phase associated with of one of the plurality of stabilizer states represented by one of one of the plurality of phase vectors;

receive a matrix representation of the at least one quantum gate; and determine the effect of the at least one quantum gate on the quantum state in a plurality of iterations, each iteration associated with a phase vector of the plurality of phase vectors and including instructions to:

apply the phase vector to the stabilizer matrix by setting leading phases of the stabilizer matrix to values of entries in the phase vector;

determine an input basis state associated with the phase vector applied to the stabilizer matrix based upon the entries in the phase vector and corresponding literals in the stabilizer matrix;

determine an input non-zero amplitude of the input basis state by Gaussian elimination or sampling of values of the stabilizer matrix;

applying the matrix representation of the at least one quantum gate to the input non-zero amplitude and the input basis state by matrix-vector multiplication to obtain an output basis state and a first output non-zero amplitude associated with the output basis state;

determine a second output non-zero amplitude of the output basis state from the result of matrix multiplication of the matrix representation of the at least one quantum gate, the stabilizer matrix, and the conjugate transpose of the matrix representation of the at least one quantum gate; and adjust the entry in the amplitude vector associated with the phase vector applied to the stabilizer matrix to maintain the global phase associated with the phase vector, wherein the entry is adjusted by multiplying the entry by a proportion of the first output non-zero amplitude to the second output non-zero amplitude; and determine a resulting quantum state using the adjusted amplitude vector.

7. The tangible, non-transitory computer-readable medium of claim 6, wherein at least one quantum gate of the quantum computer is not a stabilizer gate.

8. The tangible, non-transitory computer-readable medium of claim 6, wherein the stabilizer matrix is in reduced row-echelon form.

9. The tangible, non-transitory computer-readable medium of claim 6, wherein the executable instructions that when executed by the one or more processors cause the classical computer to receive the quantum state that is a superposition of the plurality of stabilizer states further comprise executable instructions that when executed by the one or more processors cause the classical computer to generate a stabilizer frame representing the quantum state as a superposition of orthogonal stabilizer states, wherein the stabilizer frame includes the stabilizer matrix, the plurality of phase vectors, and the amplitude vector; and further comprising executable instructions that when executed by the one or more processors cause the classical computer to determine an additional effect of a plurality of additional quantum gates on the quantum state using the stabilizer frame by sequentially applying the plurality of additional quantum gates to the stabilizer frame before measuring the resulting quantum state.

10. The tangible, non-transitory computer-readable medium of claim 9, wherein the stabilizer frame further comprises a linear combination of a plurality of mutually orthogonal stabilizer frames.

* * * * *